(12) United States Patent
Katsuhara et al.

(10) Patent No.: US 10,134,812 B2
(45) Date of Patent: Nov. 20, 2018

(54) ELECTRONIC DEVICE, IMAGE DISPLAY DEVICE, AND SENSOR TO IMPROVE CHARGE INJECTION EFFICIENCY

(71) Applicant: SONY CORPORATION, Tokyo (JP)

(72) Inventors: Mao Katsuhara, Kanagawa (JP); Hideki Ono, Tokyo (JP); Shinichi Ushikura, Kanagawa (JP); Yui Ishii, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 98 days.

(21) Appl. No.: 15/298,915

(22) Filed: Oct. 20, 2016

(65) Prior Publication Data

US 2017/0040384 A1 Feb. 9, 2017

Related U.S. Application Data

(63) Continuation of application No. 14/428,656, filed as application No. PCT/JP2013/073676 on Sep. 3, 2013, now Pat. No. 9,508,806.

(30) Foreign Application Priority Data

Sep. 28, 2012 (JP) ................................. 2012-216876

(51) Int. Cl.
*H01L 27/32* (2006.01)
*H01L 51/05* (2006.01)
(Continued)

(52) U.S. Cl.
CPC ........ *H01L 27/32* (2013.01); *H01L 21/02107* (2013.01); *H01L 21/283* (2013.01);
(Continued)

(58) Field of Classification Search
CPC ... H01L 27/32; H01L 51/5253; H01L 51/441; H01L 51/448; H01L 21/02107;
(Continued)

(56) References Cited

U.S. PATENT DOCUMENTS

| 8,008,115 B2 | 8/2011 | Katsuhara et al. |
| 2010/0051949 A1* | 3/2010 | Yamazaki ........... H01L 29/4908 257/57 |

(Continued)

FOREIGN PATENT DOCUMENTS

| JP | 2005-223107 A | 8/2005 |
| JP | 2005-327797 A | 11/2005 |

(Continued)

OTHER PUBLICATIONS

Guo-Zhen N., et al., "Organic field-effect transistor with low-cost CuI/Al bilayer electrode", Acta Physical Sinica, vol. 60, 2011, p. 127304, right column to p. 127304-2, left column, Fig. 1.

(Continued)

*Primary Examiner* — John P Dulka
(74) *Attorney, Agent, or Firm* — Chip Law Group

(57) ABSTRACT

An electronic device includes a control electrode 11 formed on a substrate 10, an insulating layer 12 covering the control electrode 11, an active layer 13 including an organic semiconductor material, which is formed on the insulating layer 12, and a first electrode 14A and a second electrode 14B formed on the active layer 13, and portions 15 of the first electrode and second electrode in contact with the active layer 13 are modified with an electrode modification material.

14 Claims, 10 Drawing Sheets

(51) Int. Cl.
  *H01L 51/10*    (2006.01)
  *H01L 21/02*    (2006.01)
  *H01L 21/283*   (2006.01)
  *H01L 27/15*    (2006.01)
  *H01L 29/40*    (2006.01)
  *H01L 51/00*    (2006.01)
  *H01L 51/50*    (2006.01)
  *H01L 51/56*    (2006.01)
  *H01L 51/44*    (2006.01)
  *H01L 51/52*    (2006.01)

(52) U.S. Cl.
  CPC .......... *H01L 27/153* (2013.01); *H01L 29/408* (2013.01); *H01L 51/0002* (2013.01); *H01L 51/0021* (2013.01); *H01L 51/0545* (2013.01); *H01L 51/105* (2013.01); *H01L 51/441* (2013.01); *H01L 51/448* (2013.01); *H01L 51/50* (2013.01); *H01L 51/5253* (2013.01); *H01L 51/56* (2013.01)

(58) Field of Classification Search
  CPC ... H01L 51/0021; H01L 29/408; H01L 51/56; H01L 51/50; H01L 21/283; H01L 27/153; H01L 51/0002; H01L 51/0545; H01L 51/105
  See application file for complete search history.

(56) References Cited

U.S. PATENT DOCUMENTS

2010/0219402 A1* 9/2010 Katsuhara ............. B82Y 10/00
                                                      257/40
2012/0045862 A1   2/2012 Thompson et al.

FOREIGN PATENT DOCUMENTS

| JP | 2006-216718 A | 8/2006 |
| JP | 2010-532555 A | 10/2010 |
| WO | 2010/061823 A1 | 6/2010 |

OTHER PUBLICATIONS

Cheng, et al., "Organic Solar Cells With Remarkable Enhanced Efficiency by Using a CuI Buffer to Control the Molecular Orientation and Modify the Anode", Applied Physics Letters, vol. 97, 2010, 03 pages.

Dimitrakopoulos, et al., "Organic Thin Film Transistors for Large Area Electronics", Advanced Materials, vol. 14, Jan. 16, 2002, pp. 99-117.

International Search Report of PCT Application No. PCT/JP2013/073676, dated Dec. 3, 2013.

* cited by examiner

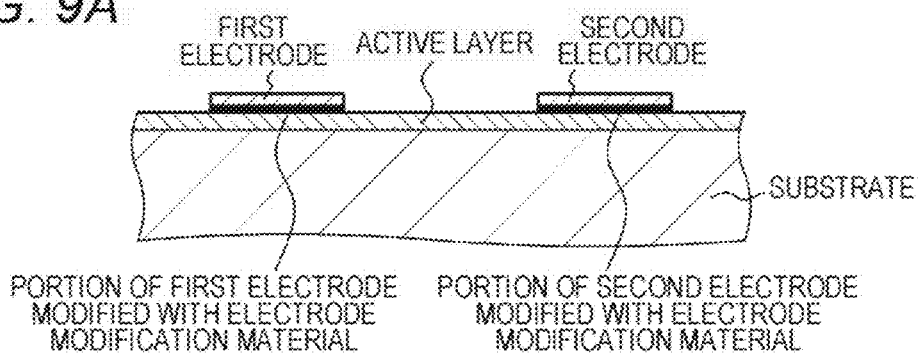
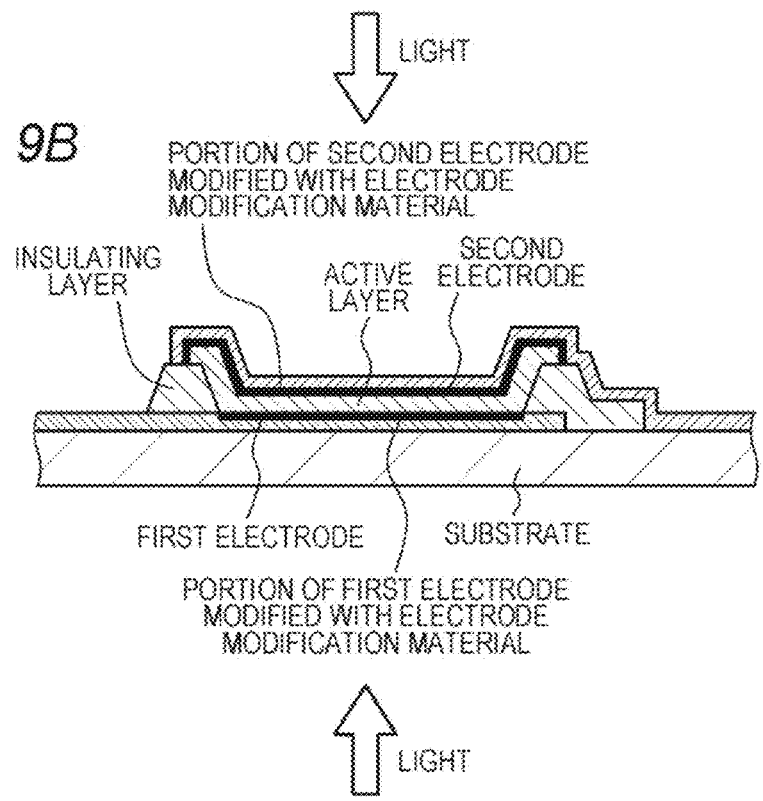

ELECTRONIC DEVICE, IMAGE DISPLAY DEVICE, AND SENSOR TO IMPROVE CHARGE INJECTION EFFICIENCY

CROSS REFERENCE TO RELATED APPLICATIONS

The present application is a continuation application of U.S. patent application Ser. No. 14/428,656 filed Mar. 17, 2015, which is a National Stage of PCT/JP2013/073676, filed Sep. 3, 2013, and claims the benefit of priority from prior Japanese Priority Patent Application JP 2012-216876 filed in Japanese Patent Office on Sep. 28, 2012, the entire contents of which are incorporated herein by reference.

TECHNICAL FIELD

The present disclosure related to an electronic device, an image display device and a sensor, a method for manufacturing an electronic device.

BACKGROUND ART

In the case of a bottom-gate TFT as a type of organic thin film transistor (organic TFT), two types of electrode structures are known, such as a top-contact structure with source/drain electrodes formed on a channel forming region including an organic semiconductor layer and a bottom-contact structure with source/drain electrodes formed below a channel forming region (see, for example, Advanded Materials vol. 14, p. 99 (2002), C. D. Dim itrakopoulos, et al.). Furthermore, also in the case of a top-gate TFT, two types of electrode structures are known, such as a top-contact structure with source/drain electrodes formed on a channel forming region and a bottom-contact structure with source/drain electrodes formed below a channel forming region.

In the case of the bottom-contact structure, high-definition electrode patterning is possible which uses a lithography technique. Therefore, in the case of achieving high integration, the bottom-contact structure is often adopted. Further, in order to improve the charge injection efficiency from the source/drain electrodes into the organic semiconductor layer, an attempt has been made to modify the surfaces of the source/drain electrodes with a thiol compound or a silane coupling agent. However, the bottom-contact structure has, due to differences in mechanical characteristic value between the source/drain electrodes and the channel forming region, problems such as difficulty in controlling strain caused at the interface on flexion or on heating, thereby leading to decreased reliability of the TFT.

CITATION LIST

Patent Document

Patent Document 1: JP 2005-327797 A
Patent Document 2: JP 2010-532555 W

Non-Patent Document

Non-Patent Document 1: Advanded Materials vol. 14, p. 99 (2002), C. D. Dimitrakopoulos, et al.

SUMMARY OF THE INVENTION

Problems to be Solved by the Invention

On the other hand, the top-contact structure is a highly reliable electrode structure, because of stronger contact between the organic semiconductor layer constituting the channel forming region and the source/drain electrode. However, because of the structure, it is difficult to improve the charge injection efficiency by modifying portions of the source/drain electrodes at the interface between the organic semiconductor layer and source/drain electrodes in contact with each other. More specifically, it is difficult to make up the source/drain electrodes with the use of an inexpensive and highly productive electrode material that is small in work function, and efficiently inject charges. Techniques for providing a charge injection layer or a doping layer between the source/drain electrodes and the channel forming region for the improvement in charge injection efficiency have been proposed in, for example, JP 2005-327797 A and JP 2010-532555 W, but have problems of resulting in a cumbersome process for manufacturing an organic TFT, or difficulty with miniaturization due to adhesion, selectivity, or the like between the organic semiconductor layer and the source/drain electrodes.

Therefore, an object of the present disclosure is to provide a top-contact electronic device which has a configuration or a structure that can improve the charge injection efficiency without causing any problems with adhesion, selectivity, reliability, or the like between the organic semiconductor layer and the source/drain electrodes, an image display device and sensor including the electronic device, as well as a method for manufacturing the electronic device.

Solutions to Problems

The method for manufacturing an electronic device according to a first aspect of the present disclosure for achieving the object mentioned above is a method for manufacturing an electronic device, which includes the respective steps of:

(A) forming a control electrode on a substrate, and an insulating layer covering the control electrode;

(B) then forming an active layer including an organic semiconductor material on the insulating layer; and (C) then forming a first electrode and a second electrode on the active layer, and the method further includes the respective steps of:

allowing the active layer to contain an electrode modification material in the step (B) or between the step (B) and the step (C), and diffusing the electrode modification material to modify, with the electrode modification material, portions of the first electrode and second electrode in contact with the active layer in the step (C) or after the step (C).

The method for manufacturing an electronic device according to a second aspect of the present disclosure for achieving the object mentioned above is a method for manufacturing an electronic device, which includes the respective steps of:

(A) forming a control electrode on a substrate, and an insulating layer covering the control electrode;

(B) then forming an active layer including an organic semiconductor material on the insulating layer; and (C) then forming a first electrode and a second electrode on the active layer, and the method further includes the respective steps of:

attaching an electrode modification material to a surface of the active layer between the step (B) and the step (C), and reacting the first electrode and second electrode with the electrode modification material to modify, with the electrode modification material, portions of the first electrode and second electrode in contact with the active layer in the step (C) or after the step (C).

The method for manufacturing an electronic device according to a third aspect of the present disclosure for achieving the object mentioned above is a method for manufacturing an electronic device, which includes the respective steps of:

(A) forming an active layer including an organic semiconductor material on a substrate;

(B) then forming a first electrode and a second electrode on the active layer; and (C) then forming the insulating layer and the control electrode on the active layer, the first electrode, and the second electrode, and the method further includes the respective steps of:

allowing the active layer to contain an electrode modification material in the step (A) or between the step (A) and the step (B), and diffusing the electrode modification material to modify, with the electrode modification material, portions of the first electrode and second electrode in contact with the active layer in the step (B), or between the step (B) and the step (C), or after the step (C).

The method for manufacturing an electronic device according to a fourth aspect of the present disclosure for achieving the object mentioned above is a method for manufacturing an electronic device, which includes the respective steps of:

(A) forming an active layer including an organic semiconductor material on a substrate;

(B) then forming a first electrode and a second electrode on the active layer; and (C) then forming the insulating layer and the control electrode on the active layer, the first electrode, and the second electrode, and the method further includes the respective steps of:

attaching an electrode modification material to a surface of the active layer between the step (A) and the step (B), and reacting the first electrode and the second electrode with the electrode modification material to modify, with the electrode modification material, portions of the first electrode and second electrode in contact with the active layer in the step (B), or between the step (B) and the step (C), or after the step (C).

The electronic device according to the first aspect of the present disclosure for achieving the object mentioned above is an electronic device including:

a control electrode formed on a substrate;

an insulating layer covering the control electrode;

an active layer including an organic semiconductor material, which is formed on the insulating layer; and a first electrode and a second electrode formed on the active layer, and portions of the first electrode and second electrode in contact with the active layer are modified with an electrode modification material.

The electronic device according to the second aspect of the present disclosure for achieving the object mentioned above is an electronic device including:

an active layer including an organic semiconductor material, which is formed on a substrate;

a first electrode and a second electrode formed on the active layer, an insulating layer formed on the active layer, and the first electrode and the second electrode;

a control electrode formed on the insulating layer, and portions of the first electrode and second electrode in contact with the active layer are modified with an electrode modification material.

The image display device according to the present disclosure for achieving the object mentioned above includes a semiconductor device including the electronic device according to the first aspect or second aspect of the present disclosure, the control electrode in the electronic device corresponds to a gate electrode in the semiconductor device, the insulating layer in the electronic device corresponds to a gate insulating layer in the semiconductor device, and the first electrode and second electrode in the electronic device correspond to source/drain electrodes in the semiconductor device.

The sensor according to the present disclosure for achieving the object mentioned above includes the electronic device according to the first aspect or second aspect of the present disclosure.

Effects of the Invention

In the method for manufacturing an electronic device according to the first aspect or third aspect of the present disclosure, the electrode modification material contained in the active layer is diffused into the first electrode and the second electrode to modify, with the electrode modification material, the portions of the first electrode and second electrode in contact with the active layer. In addition, in the method for manufacturing an electronic device according to the second aspect or fourth aspect of the present disclosure, the electrode modification material attached to the surface of the active layer is reacted with the first electrode and the second electrode to modify, with the electrode modification material, the portions of the first electrode and second electrode in contact with the active layer. Furthermore, in the electronic device according to the first aspect or second aspect of the present disclosure, and the electronic device constituting the image display device or sensor according to the present disclosure, the portions of the first electrode and second electrode in contact with the active layer are modified with the electrode modification material. Accordingly, it becomes possible to improve the charge injection efficiency without causing any problems with adhesion and selectivity, reliability, or the like between the organic semiconductor layer and the source/drain electrodes.

BRIEF DESCRIPTION OF DRAWINGS

FIGS. 9A and 9B are schematic partial cross-sectional views of two-terminal electronic devices.

MODE FOR CARRYING OUT THE INVENTION

Figure 1A:
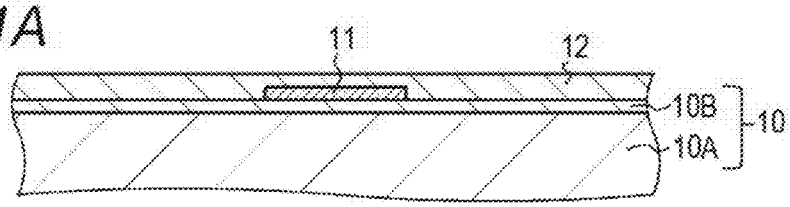
FIGS. 1A, 1B, 1C, and 1D are schematic partial cross-sectional views of a substrate and the like, for explaining a method for manufacturing an electronic device of Example 1.
Figure 1B:
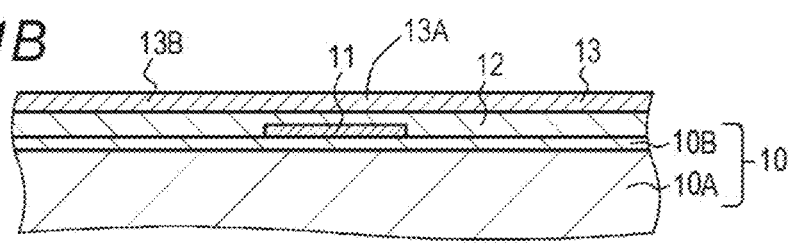
Figure 1C:
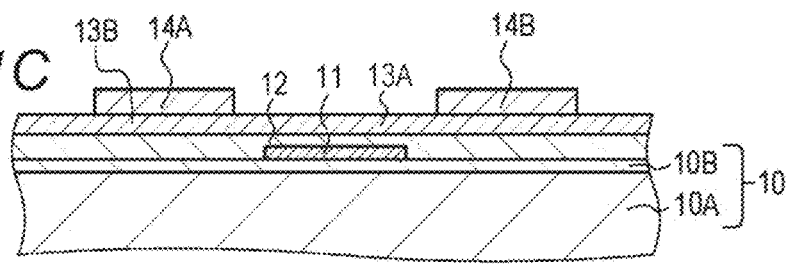

While the present disclosure will be described in accordance with examples with reference to the drawings, the present disclosure is not to be considered limited to the examples, but various numerical values and materials in the examples are considered by way of example. It is to be noted that the description will be carried out in the following order.

1. General descriptions of methods for manufacturing electronic devices according to the first to fourth aspects of the present disclosure, electronic devices according to the first to second aspects of the present disclosure, image display devices, as well as sensors.

2. Example 1 (a method for manufacturing an electronic device according to the first aspect of the present disclosure, an electronic device according to the first aspect of the present disclosure, and an image display device)

3. Example 2 (Modification of Example 1)

4. Example 3 (a method for manufacturing an electronic device according to the second aspect of the present disclosure, an electronic device according to the first aspect of the present disclosure, and an image display device)

5. Example 4 (Modification of Example 3)

6. Example 5 (a method for manufacturing an electronic device according to the third aspect of the present disclosure, an electronic device according to the second aspect of the present disclosure, and an image display device)

7. Example 6 (Modification of Example 5)

8. Example 7 (a method for manufacturing an electronic device according to the fourth aspect of the present disclosure, an electronic device according to the second aspect of the present disclosure, and an image display device)

9. Example 8 (Modification of Example 7)

10. Example 9 (modifications of Examples 1 to 8 and a sensor according to the present disclosure), others

[General descriptions of methods for manufacturing electronic devices according to the first to fourth aspects of the present disclosure, electronic devices according to the first to second aspects of the present disclosure, image display devices, as well as sensors]

In a method for manufacturing an electronic device according to the first aspect or second aspect of the present disclosure, as a form of the method, a protective film can be formed over a portion of an active layer before forming a first electrode and a second electrode on the active layer, and the first electrode and the second electrode can be formed on the active layer and the protective film in the (C). Furthermore, in a method for manufacturing an electronic device according to the third aspect or fourth aspect of the present disclosure, as a form of the method, a protective film can be formed over a portion of an active layer before forming a first electrode and a second electrode on the active layer, and the first electrode and the second electrode can be formed on the active layer and the protective film in the (B). This eliminates or reduces the fear of damage to the active layer in the formation of the first electrode and second electrode on the active layer and protective film, in particular, in patterning for the formation of the first electrode and second electrode. Moreover, in these cases, it is preferable to remove the protective film exposed between the first electrode and the second electrode after the formation of the first electrode and second electrode on the active layer and the protective film, thereby eliminating or reducing the fear of peeling the first electrode or the second electrode from the active layer due to stress generated in the protective layer.

In the method for manufacturing an electronic device according to the first aspect or third aspect of the present disclosure, including the preferred forms described above, an electrode modification material is preferably configured to be thermally diffused.

Furthermore, the electronic device according to the first aspect or second aspect of the present disclosure, and the electronic device constituting the image display device or sensor of the present disclosure can have the form of a protective film formed between a portion of the first electrode and the active layer and between a portion of the second electrode and the active layer. It is to be noted that the protective film may extend on the active layer located between the first electrode and the second electrode, or the protective film may be removed from on the active layer located between the first electrode and the second electrode.

In the methods for manufacturing electronic devices according to the first to fourth aspects of the present disclosure, including the preferred forms described above, or the electronic devices according to the first to second aspects of the present disclosure, including the preferred forms described above, and the electronic device constituting the image display device or sensor of the present disclosure, the electrode modification material is preferably at least one material selected from the group consisting of halogen atoms, metal halides, metal sulfur compounds, thiols, disulfides, chlorosilanes, alkoxysilanes, carboxylic acids, phenols, and phosphonic acids. Specifically, examples of the halogen atoms can include iodine, bromine, and chlorine, examples of the metal halides can include copper iodide and iron chloride, and examples of the metal sulfur compounds can include copper sulfide and iron sulfide. Further, examples of the thiols can include benzene thiol, tetrafluorobenzene thiol, alkane thiol, and alkane dithiol. Furthermore, examples of the disulfides can include dialkyldisulfide and diphenyldisulfide, examples of the chlorosilanes can include monoalkylchlorosilane such as octadecyltrichlorosilane, perfluoroalkyltrichlorosilane, and octyltrichlorosilane, as well as aminoalkylsilane, epoxyalkylsilane, and mercaptoalkylsilane, examples of the alkoxysilanes can include alkyl tetramethoxysilane and alkyl tetraethoxysilane, examples of the carboxylic acids can include acetic acid, propionic acid, and stearic acid, examples of the phenols can include phenol, bisphenol, and alkylphnols such as cresol, and examples of the phosphonic acids can include alkylphosphonic acids such as octadecylphosphonic acid.

It is to be noted that in the method for manufacturing an electronic device according to the first aspect or third aspect of the present disclosure, or electronic devices manufactured by the method for manufacturing an electronic device according to the first aspect or third aspect of the present disclosure, usable electrode modification materials can include at least one type of material selected from the group consisting of halogen atoms, metal halides, and metal sulfur compounds, whereas in the method for manufacturing an electronic device according to the second aspect or fourth aspect of the present disclosure, or electronic devices manufactured by the method for manufacturing an electronic device according to the second aspect or fourth aspect of the present disclosure, usable electrode modification materials can include at least one type of material selected from the group consisting of thiols, disulfides, chlorosilanes, alkoxysilanes, and carboxylic acids, phenols, and phosphonic acids.

Moreover, in the methods for manufacturing electronic devices according to the first to fourth aspects of the present disclosure, including the preferred forms described above, or the electronic devices according to the first to second aspects of the present disclosure, including the preferred forms described above, and the electronic device constituting the image display device or sensor of the present disclosure, the modification of the first electrode and second electrode with the electrode modification material promotes the optimization, or preferably promotes the optimization between the value of the work function in portions of the first electrode and second electrode in contact with the active layer and the value of the work function in the active layer.

In addition, in the method for manufacturing an electronic device according to the first aspect or third aspect of the present disclosure, or electronic device manufactured by the method for manufacturing an electronic device according to the first aspect or third aspect of the present disclosure, the concentration of the electrode modification material in the portions of the first electrode and second electrode which are modified with the electrode modification material can have the form of decrease with distance from the interface between the first electrode and second electrode and the active layer. On the other hand, in the method for manufacturing an electronic device according to the second aspect or fourth aspect of the present disclosure, or electronic device manufactured by the method for manufacturing an electronic device according to the second aspect or fourth aspect of the present disclosure, the portions of the first electrode and second electrode which are modified with the electrode modification material can have the form of 2 nm or less in thickness.

In the methods for manufacturing electronic devices according to the first to fourth aspects of the present disclosure, electronic devices according to the first to second aspects of the present disclosure, and electronic device constituting the image display device or sensor according to the present disclosure, including various types of preferred forms and configurations described above (hereinafter, which may be referred to collectively as "the present disclosure" simply), organic semiconductor materials for constituting the active layer can include polymers and polycondensation products: e.g., polypyrrole and derivatives thereof; polythiophene and derivatives thereof; isothianaphthenes such as polyisothianaphthene; thenylenevinylenes such as polythenylenevinylene; poly(p-phenylenevinylene) series such as poly(p-phenylenevinylene); polyaniline and derivatives thereof; polyacetylenes; polydiacetylenes; polyazulenes; polypyrenes; polycarbazoles; polyselenophenes; polyfurans; poly(p-phenylene) series; polyindoles; polypyridines; and polyvinylcarbazole, polyphenylenesulfide, and polyvinylenesulfide. Alternatively, the materials can also include oligomers having the same repeating units as those of the polymers. Alternatively, the materials can include acenes such as naphthacene, pentacene[2,3,6,7-dibenzanthracene] and derivatives thereof, anthradithiophene derivatives, oligothiophene derivatives, hexacene, heptacene, dibenzopentacene, tetrabenzopentacene, pyrene, benzopyrene, dibenzopyrene, chrysene, perylene, coronene, terylene, ovalene, quaterrylene, and circumanthracene, and derivatives with carbon partially substituted with a functional group such as atoms, e.g., N, S, and O, and carbonyl groups (dioxaanthanthrene compounds including peri-xanthenoxanthene and derivatives thereof, triphenodioxazine, triphenothiazine, hexacene-6,15-quinone, peri-xanthenoxanthene [PXX, 6,12-dioxaanthanthrene], or the like) and derivatives thereof with hydrogen substituted with other functional groups. Alternatively, the materials can also include metal phthalocyanine typified by copper phthalocyanine; tetrathiafulvalene and tetrathiafulvalene derivatives; tetrathiapentalene and derivatives thereof; condensed ring tetracarboxylic acid diimides such as naphthalene 1,4,5,8-tetracarboxylic acid diimide, N,N'-bis(4-trifluoromethylbenzyl)naphthalene 1,4,5,8-tetracarboxylic acid diimide, N,N'-bis(1H,1H-perfluorooctyl), N, N'-bis(1H,1H-perfluorobutyl), and N, N'-dioctylnaphthalene 1,4,5,8-tetracarboxylic acid diimide; naphthalene tetracarboxylic acid diimides such as naphthalene 2,3,6,7 tetracarboxylic acid diimide; anthracene tetracarboxylic acid diimides such as anthracene-2,3,6,7 tetracarboxylic acid diimide; fullerenes such as C60, C70, C76, C78, and C84, and derivatives thereof; carbon nanotubes such as SWNT; dyes such as merocyanine dyes and hem icyanine dyes, and derivatives thereof. Alternatively, the materials can include poly-3-hexylthiophene [P3HT] with a hexyl group introduced into polyethylene, polyanthracene, triphenylene, polytellurophene, polynaphthalene, polyethylenedioxythiophene, poly(3,4-ethylenedioxythiophene)/polystyrene sulfonate [PEDOT/PSS], and quinacridone. Alternatively, the materials can include compounds selected from the group consisting of polycondensed aromatic compounds, porphyrin derivatives, conjugated oligomers of phenylvinylidene series, and conjugated oligomers of thiophene series. Specifically, the compounds can include, for example, polycondensed aromatic compounds such as acene molecules (pentacene, tetracene, or the like), porphyrin molecules, and conjugated oligomers (phenylvinylidene and thiophene oligomers). Alternately, the compounds can include, for example, porphyrin, 4,4'-biphenyldithiol (BPDT), 4,4'-diisocyanobiphenyl, 4,4'-diisocyano-p-terphenyl, 2,5-bis(5'-thioacetyl-2'-thiophenyl)thiophene, 2,5-bis(5'-thioacetoxyl-2'-thiophenyl)thiophene, 4,4'-diisocyanophenyl, benzidine(biphenyl-4,4'-diamine), TCNQ (tetracyanoquinodimethane), tetrathiafulvalene (TTF) and derivatives thereof, charge-transfer complexes typified by tetrathiafulvalene (TTF)-TCNQ complexes, bisethylenetetrathiafulvalene (BEDTTTF)-perchloric acid complexes, BEDTTTF-iodine complex, and TCNQ-iodine complexes, biphenyl-4,4'-dicarboxylic acid, 1,4-di(4-thiophenylacetylenyl)-2-ethylbenzene, 1,4-di(4-isocyanophenylacetylenyl)-2-ethylbenzene, dendrimers, 1,4-di(4-thiophenylethynyl)-2-ethylbenzene, 2,2"-dihydroxy-1,1':4',1"-terphenyl, 4,4'-biphenyldiethanal, 4,4'-biphenyldiol, 4,4'-biphenyldiisocyanate, 1,4-diacetynylbenzene, diethylbiphenyl-4,4'-dicarboxylate, benzo[1,2-c;3,4-c';5,6-c"]tris[1,2]dithiol-1,4,7-trithione, α-sexithiophene, tetrathiatetracene, tetraselenotetracene, tetratellurium tetracene, poly(3-alkylthiophene), poly(3-thioprne-β-ethanesulfonic acid), poly(N-alkylpyrrole)poly(3- alkylpyrrole), poly(3,4-dialkylpyrrole), poly(2,2'-thienylpyrrole), and poly(dibenzothiophenesulfide).

Methods for forming the active layer can include various types of physical vapor deposition methods (PVD methods) including resistance heating deposition methods, sputtering methods, and vacuum deposition methods, as well as application methods. The application methods herein can include: various types of printing methods such as screen printing methods, ink-jet methods, offset printing methods, reverse offset printing methods, gravure printing methods, gravure offset printing methods, relief printing, flexographic printing, and microcontact methods; various types coating methods such as air doctor coater methods, blade coater methods, road coater methods, knife coater methods, squeeze coater methods, reverse roll coater methods, transfer roll coater methods, gravure coater methods, kiss coater methods, cast coater methods, spray coater methods, slit coater methods, slit orifice coater methods, colander coater methods, casting methods, capillary coater methods, bar coater methods, and dipping methods; methods of applying liquid materials, such as spray methods, methods using dispensers; and stamp methods.

Furthermore, in the present disclosure, materials for constituting the substrate can include flexible plastic films, plastic sheets, and plastic substrates including organic polymers, as exemplified by polymethylmethacrylate (polymethylmethacrylate, PMMA) and polyvinyl alcohol (PVA), polyvinylphenol (PVP), polyethersulfone (PES), polyimide, polyamide, polyacetal, polycarbonate (PC), polyethylene terephthalate (PET), polyethylene naphthalate (PEN), polyethyl ether ketone, and polyolefin, or include mica. The use of the substrate including such a flexible organic polymer or a polymeric material makes it possible to incorporate or integrate the electronic device into, for example, curved-surface image display device or electronic appliance. Alternatively, the substrate can include various types of glass substrates, various types of glass substrates with an insulating film formed on surfaces thereof, quartz substrates, quartz substrates with an insulating film formed on surfaces thereof, silicon substrates with an insulating film formed on surfaces thereof, Sapphire substrates, metallic substrates including various types of alloys or various types of metals, such as stainless steel, aluminum, and nickel, metal foil, and paper. The substrate may be placed on a supporting member (or above the supporting member) appropriately selected from the materials mentioned above. The supporting member can include, besides, conductive substrates (substrates including metals such as gold and aluminum, substrates including highly oriented graphite, stainless steel substrates, or the like). On these substrates, a functional film may be formed, such as a buffer layer for improving adhesion or flatness or a barrier film for improving gas barrier properties.

The materials constituting the first electrode and the second electrode can include, specifically, copper (Cu: 4.5 eV), gold (Au: 5.0 eV), molybdenum (Mo: 4.4 eV), titanium (Ti: 4.1 eV), aluminum (Al: 4.2 eV), nickel (Ni: 5.2 eV), platinum (Pt: 5.2 eV), silver (Ag: 4.3 eV), and palladium (Pd: 4.9 eV), or include transparent oxide conductors such as ITO, IZO, and AZO.

In the method for manufacturing an electronic device according to the first or third aspect of the present disclosure, or electronic device manufactured by the method for manufacturing an electronic device according to the first or third aspect of the present disclosure, the combination of (the material constituting the first electrode and the second electrode, the electrode modification material) can specifically include, but not limited thereto, (copper, iodine), (gold, iodine), (silver, iodine), (copper, sulfur), and (molybdenum, chlorine). In addition, in the method for manufacturing an electronic device according to the second or fourth aspect of the present disclosure, or electronic device manufactured by the method for manufacturing an electronic device according to the second or fourth aspect of the present disclosure, the combination of (the material constituting the first electrode and the second electrode, the electrode modification material) can specifically include, but not limited thereto, (gold, thiols), (copper, thiols), (aluminum, phosphonic acids), (titanium, phosphonic acids), and (molybdenum, phosphonic acids).

Materials for constituting the control electrode, and for wirings provided, as required, can include gold (Au), platinum (Pt), silver (Ag), palladium (Pd), tungsten (W), tantalum (Ta), molybdenum (Mo), aluminum (Al), chromium (Cr), titanium (Ti), copper (Cu), nickel (Ni), indium (In), tin (Sn), iron (Fe), cobalt (Co), zinc (Zn), magnesium (Mg), manganese (Mn), ruthenium (Rh), rubidium (Rb), or alloys containing these metal elements, conductive particles including these metals, conductive particles of alloys containing the metals, and conductive substances such as polysilicon containing impurities, and also have a stacked structure of layers containing the elements. Moreover, the materials can also include organic materials (conductive polymers) such as poly(3,4-ethylenedioxythiophene)/(polystyrene sulfonate) [PEDOT/PSS], TTF-TCNQ and polyaniline.

Methods for forming the control electrode, the first electrode, the second electrode, and the like can include various types of PVD methods; various types of chemical vapor deposition methods (CVD methods) including pulsed laser deposition methods (PLD), arc discharge methods, and MOCVD methods; liftoff methods; shadow mask methods; and the various types of application methods mentioned above, using an ink or a paste. In addition, the electrodes and the like may be formed by a plating method such as an electrolytic plating or an electroless plating method. Moreover, the methods may be combined with a patterning technique, if necessary. It is to be noted that the PVD methods can include: (a) various types of vacuum deposition methods such as electron beam heating methods, resistance heating methods, flash deposition, methods of heating crucibles; (b) plasma deposition methods; (c) various types of sputtering methods such as bipolar sputtering methods, direct-current sputtering methods, direct-current magnetron sputtering methods, high-frequency sputtering methods, magnetron sputtering methods, ion beam sputtering methods, and bias sputtering methods; and (d) various types of ion plating methods such as direct current (DC) methods, RF methods, multicathode methods, activated reaction methods, electric field deposition methods, high-frequency ion plating methods, and reactive ion plating methods. In the case of forming the control electrode, the first electrode, and the second electrode in accordance with an etching method, a dry etching method and a wet etching method may be adopted, and the dry etching method can include, for example, ion milling and reactive ion etching (RIE). In addition, the control electrode and the like can be also formed in accordance with a laser ablation method, a mask deposition method, or a laser transfer method.

Materials for constituting the insulating layer can include inorganic insulating materials and organic insulating materials. The inorganic insulating materials can include materials such as silicon oxide materials, silicon nitride ($SiN_y$), aluminum oxide ($Al_2O_3$), titanium oxide, and hafnium oxide $HfO_2$. Examples of the silicon oxide materials herein can include silicon oxide ($SiO_x$), BPSG, PSG, BSG, AsSG, PbSG, silicon oxynitride (SiON), Spin On Glass (SOG), and low-dielectric constant $SiO_2$ materials (e.g., polyarylether, cycloperfluorocarbon polymer and benzocyclobutene, cyclic fluorine resins, polytetrafluoroethylene, arylether fluoride, fluorinated polyimide, amorphous carbon, organic SOG). Methods for forming insulating layers including the inorganic insulating materials can include the various types of application methods mentioned above, and vacuum processes such as the various types of PVD methods and CVD methods mentioned above, or include sol-gel methods, lift-off methods, electrodeposition methods, and shadow mask methods using solutions with the inorganic insulating materials dissolved therein. In addition, the methods can also include combinations of any of the methods for the formation with a patterning technique. On the other hand, the organic insulating materials can include polymeric materials such as phenolic resins, polyvinylphenol resins, polyimide resins, novolac resins, cinnamate resins, acrylic resins, epoxy resins, styrene resins, polyparaxylylene resins, and fluorine resins, and include cyclic cycloolefin polymers or cyclic cycloolefin copolymers [specifically, TOPAS (manufactured by Topas Advanced Polymers GmbH, registered trademark), ARTON (manufactured by JSR Corporation, registered trademark), and ZEONOR (manufactured by Zeon Corporation, registered trademark]. Methods for forming insulating layers including the organic insulating materials can include the various types of application methods mentioned above, and use vacuum processes such as PVD methods and CVD methods.

The insulating layer and the active layer may be subjected to patterning in accordance with a well-known method such as, a wet etching method, a dry etching method, and a laser ablation method, if necessary.

Materials for constituting the protective film can include the various types of materials described for the insulating layer, and methods for forming the protective layer can include the methods for the formation, described for the insulating layer.

Materials for allowing the active layer to contain the electrode modification material can include, specifically, a method for allowing the electrode modification material to be contained in a solution of the organic semiconductor material constituting the active layer, forming a film from the solution by an application method, and drying the film; a method for forming the active layer, then applying a solution containing the electrode modification material to the active layer, and carrying out drying; a method for forming the active layer, then placing the layer in an atmosphere containing the electrode modification material; and a method for forming a film from the organic semiconductor material constituting the active layer and the electrode modification material simultaneously in accordance with a PVD method. Furthermore, methods for attaching the electrode modification material to the surface of the active layer can include, specifically, a method for forming the active layer, then applying a solution containing the electrode modification material to the active layer, and carrying out drying; a method for forming the active layer, and then placing the layer in an atmosphere containing the electrode modification material; and a method for forming the active layer, and then forming a film from the electrode modification material in accordance with a PVD method. Methods for thermally diffusing the electrode modification material can include, specifically, a method for allowing the electrode modification material to contained in the active layer, and heating the whole while forming the first electrode and the second electrode on the active layer, or after the formation of the electrodes, and the heating treatment can be also skipped in the case of diffusion spontaneously proceeding at room temperature. Furthermore, methods for reacting the first electrode and the second electrode with the electrode modification material can include, specifically, a method for allowing the electrode modification material to contained in the active layer, and heating the whole while forming the first electrode and the second electrode on the active layer, or after the formation of the electrodes, and the heating treatment can be also skipped in the case of the reaction spontaneously proceeding. It is to be noted that whether the electrode modification material is contained in the active layer, or attached to the surface of the active layer depends on the electrode modification material used, when the solution containing the electrode modification material is applied to the active layer and dried, or placed in the atmosphere containing the electrode modification material.

In the present disclosure, "modifying" portions of the first electrode and second electrode in contact with the active layer with the electrode modification material specifically means that chemical bonding such as covalent bonding or ionic bonding are formed between the atoms or molecules constituting the first electrode and second electrode and the atoms or molecules constituting the electrode modification material. Furthermore, methods for measuring the concentration distribution of the electrode modification material in the first electrode and the second electrode can include, specifically, X-ray photoelectron spectroscopy, Auger spectroscopy, and time-of-flight secondary ion mass spectrometry, and methods for measuring the thicknesses of portions of the first electrode and second electrode modified with the electrode modification material can include, specifically, X-ray photoelectron spectroscopy, Auger spectroscopy, and time-of-flight secondary ion mass spectrometry.

The electronic device of the present disclosure may have a so-called three-terminal structure, or have a two-terminal structure. The electronic device which has a three-terminal structure constitutes, for example, a field-effect transistor, more specifically, a thin film transistor (TFT), or constitutes a light-emitting element. More specifically, the device can constitute a light-emitting element (an organic light-emitting element, an organic light-emitting transistor) where the active layer emits light through voltage application to the control electrode, the first electrode, and the second electrode. In these electronic devices, the voltage applied to the control electrode controls the current flowing through the active layer from the first electrode toward the second electrode. Whether the electronic device fulfills a function as a field-effect transistor or functions as a light-emitting element depends on the voltage application state (bias) to the first electrode and the second electrode. First, a current flows from the first electrode to the second electrode by modulating the control electrode while a bias is applied to the extent that no electron is injected from the second electrode. This is a transistor operation. On the other hand, when the bias to the first electrode and the second electrode is increased while holes are sufficiently accumulated, electron injection is started to emit light through recombination with the holes. Furthermore, the electronic device which has a two-terminal structure can include a photoelectric conversion element where a current flow between the first electrode and the second electrode when the active layer is irradiated with light.

The sensor of the present disclosure can include optical sensors and photoelectric conversion elements (specifically, solar cells and image sensors). Specifically, dyes which absorb light (including not only visible light, but also ultraviolet light and infrared light) may be used as organic semiconductor molecules constituting the active layer of an optical sensor. In addition, in the photoelectric conversion element, a current flow between the first electrode and the second electrode when the active layer is irradiated with light (including not only visible light, but also ultraviolet light and infrared light). It is to be noted that the electronic device which has a three-terminal structure can also constitute a photoelectric conversion element, in this case, the voltage application to the control electrode need not be carried out, or may be carried out, and in the latter case, the voltage application to the control electrode makes it possible to modulate the flowing current. In addition, the sensor of the present disclosure can also include a chemical substance sensor for measuring the amount (concentration) of a chemical substance adsorbed on the active layer by applying a current between the first electrode and the second electrode or applying an appropriate voltage between the first electrode and the second electrode, and measuring the electric resistance value of the active layer, using the fact that the electric resistance value between the first electrode and the second electrode is changed when the chemical substance to be detected is adsorbed onto the active layer. Alternatively, the sensor can also include a molecular sensor that has a molecular recognition ability, and a biosensor prepared by binding and anchoring binding molecules (for example, biomolecules) onto the surface of the active layer, and further adding functional molecules (for example, another biomolecules) that interact with the binding molecules. It is to be noted that the chemical substance is brought into adsorption equilibrium on the active layer, and thus, when the amount (concentration) of the chemical substance in the atmosphere with the active layer placed therein is changed with time, the equilibrium state is also changed. Examples of the chemical substance can include, for example, $NO_2$ gas, $O_2$ gas, $NH_3$ gas, styrene gas, hexane gas, octane gas, decane gas, and trimethylbenzene gas.

Examples of a device with the electronic device of the present disclosure incorporated therein can include, but not limited to, an image display device as an example. The image display device herein can include various types of image display devices (for example, organic electroluminescence display devices, liquid crystal display devices, plasma display devices, electrophoretic display devices, cold cathode field emission displays, or the like) in so-called desktop personal computers, notebook-type personal computers, mobile personal computers, tablet terminals including tablet personal computers, personal digital assists (PDAs), car navigation systems, cellular phones and smartphones, game machines, electronic books, electronic papers such as electronic newspapers, bulletin boards such as signs, posters, and blackboards, rewritable papers alternative to papers for copy machines and printers, calculators, display units of home electric appliances, display units of cards such as discount cards, electronic advertisements, and electronic POPs. Further, the image display device can include various types of lighting devices.

In the case of applying or using the electronic device of the present disclosure to or for image display devices as well as various types of electronic appliances including electronic papers and Radio Frequency Identification Card (RFIDs), a large number of electronic devices integrated on a supporting member may be made as a monolithic integrated circuit, or each electronic device may be cut for individualization, and may be used as discrete components. In addition, the electronic device may be sealed with a resin.

Example 1

Example 1 relates to a method for manufacturing an electronic device according to the first aspect of the present disclosure, and an electronic device according to the first aspect of the present disclosure, as well as an image display device.

Figure 1D:
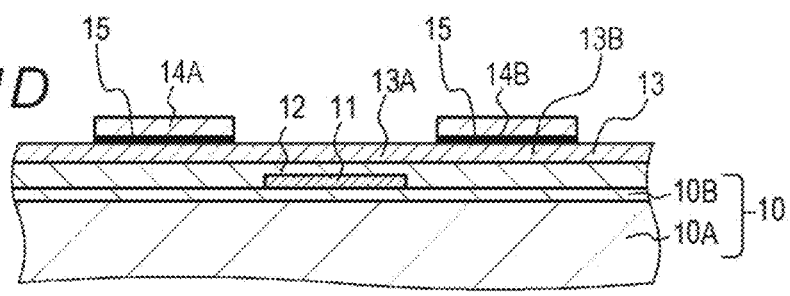

The electronic device of Example 1 of a bottom gate/top contact type is a three-terminal electronic device, specifically, a TFT, which is an electronic device including: as in the schematic partial cross-sectional view shown in FIG. 1D, (a) a control electrode 11 formed on a substrate 10;

(b) an insulating layer 12 covering the control electrode 11;

(c) an active layer 13 including an organic semiconductor material, which is formed on the insulating layer 12; and (d) a first electrode 14A and a second electrode 14B formed on the active layer 13, where portions of the first electrode 14A and second electrode 14B in contact with the active layer 13 are modified with an electrode modification material.

It is to be noted that in the following, the term "gate electrode 11" may be used for explanations, instead of the "control electrode 11", the term "channel forming region 13A and/or channel forming region extension 13B" may be used for explanations, instead of the "active layer 13", the term "source/drain electrodes 14A, 14B" may be used for explanations, instead of the "first electrode 14A and second electrode 14B", and the term "gate insulating layer 12" may be used for explanations, instead of the "insulating layer 12".

Specifically, in Example 1 or Examples 2 to 9 as will be described later, the substrate 10 includes a glass substrate 10A with an insulating film 10B including $SiO_2$ formed on a surface thereof. Furthermore, the gate electrode 11 includes aluminum, the gate insulating layer 12 includes polyvinylphenol (PVP), the channel forming region 13A and the channel forming region extension 13B includes a derivative of peri-Xanthenoxanthene (PXX, 6,12-dioxaanthanthrene), more specifically, ethylphenyl-PXX, and the source/drain electrodes 14A, 14B includes copper (Cu).

Furthermore, in Examples 1 to 2, Examples 5 to 6, and Example 9, the electrode modification material includes a halogen atom, specifically, iodine ($I_2$). Moreover, portions of the source/drain electrodes 14A, 14B in contact with the channel forming region extension 13B are modified with the electrode modification material, and the portions of the source/drain electrodes 14A, 14B, which are modified with the electrode modification material (for convenience sake, referred to as 'modified regions 15') includes copper iodide (CuI).

The image display devices of Examples 1 to 8 include semiconductor devices including the electronic devices of Examples 1 to 8, the control electrode in the electronic device corresponds to the gate electrode 11 in the semiconductor device, the insulating layer in the electronic device corresponds to the gate insulating layer 12 in the semiconductor device, and the first electrode and second electrode in the electronic device correspond to source/drain electrodes 14A, 14B in the semiconductor device.

A method for manufacturing the three-terminal electronic device (bottom gate/top contact TFT) of Example 1 will be described below with reference to FIGS. 1A, 1B, 1C, and 1D which are schematic partial cross-sectional views of a substrate and the like.

[Step-100]

First, the gate electrode 11 and the gate insulating layer 12 covering the gate electrode 11 are formed on the substrate 10. Specifically, on the insulating film 10B including $SiO_2$ formed on a surface of the glass substrate 10A, a resist layer (not shown) obtained by removing a portion for the formation of the gate electrode 11 is formed in accordance with a lithography technique. Thereafter, a titanium (Ti) layer of 10 nm in thickness (not shown) as an adhesion layer, and an aluminum (Al) layer of 50 nm in thickness as the gate electrode 11 are sequentially formed by a sputtering method over the entire surface, and then, the resist layer is removed. In this way, the gate electrode 11 can be obtained in accordance with a so-called liftoff method. It is to be noted that depending on the material used, the gate electrode 11 can be also formed in accordance with a printing method on the insulating film 10B including $SiO_2$ formed on the surface of the glass substrate 10A. Thereafter, a polyvinylphenol (PVP) solution containing a cross-linking agent is applied onto the substrate 10 and the gate electrode 11 in accordance with a slit coater method, and then heated to 150° C. to obtain the gate insulating layer 12 including polyvinylphenol. In this way, the structure shown in FIG. 1A can be obtained.

[Step-110]

Next, the channel forming region 13A and channel forming region extension 13B including an organic semiconductor material are formed on the gate insulating layer 12. In this case, the channel forming region 13A and channel forming region extension 13B are adapted to contain the electrode modification material. Specifically, a solution of the organic semiconductor material constituting the active layer (more specifically, a solution of ethylphenyl-PXX with toluene as a solvent) can be formed into a film by a slit coater method, and dried at 140° C. to form the channel forming region 13A and channel forming region extension 13B of 20 nm in thickness. In this way, the structure shown in FIG. 1B can be obtained. Then, the channel forming region 13A and the channel forming region extension 13B can be placed in an atmosphere containing a vapor of iodine ($I_2$) as the electrode modification material to achieve the active layer (the channel forming region 13A and the channel forming region extension 13B) containing the electrode modification material ($I_2$). The gate insulating layer 12 and the channel forming region extension 13B may be subjected to patterning in accordance with a well-known method such as, a wet etching method, a dry etching method, and a laser ablation method, if necessary.

Alternatively, the active layer 13 including the organic semiconductor material (the channel forming region 13A and the channel forming region extension 13B), containing the electrode modification material, can be also formed on the gate insulating layer 12 by allowing the electrode modification material to be contained in a solution of the organic semiconductor material constituting the active layer 13, and forming a film from the solution by an application method, and carrying out drying.

[Step-120]

Thereafter, the source/drain electrodes 14A, 14B are formed on the active layer 13 (specifically, on the channel forming region extension 13B). Specifically, after forming a copper (Cu) layer of 100 nm in thickness in accordance with a vacuum deposition method, the copper layer can be subjected to patterning in accordance with a lithography technique and an etching technique to obtain the source/drain electrodes 14A, 14B. In this way, the structure shown in FIG. 1C can be obtained. It is to be noted that in the film formation for the source/drain electrodes 14A, 14B, the source/drain electrodes 14A, 14B can be formed without any photo lithography process by partially covering the channel forming region 13A and the channel forming region extension 13B with a hard mask. In addition, the source/drain electrodes 14A, 14B can be also formed in accordance with a printing method.

[Step-130]

Next, the electrode modification material is diffused to modify, with the electrode modification material, portions of the source/drain electrodes 14A, 14B in contact with the channel forming region extension 13B. Specifically, the whole is heated to 100° C. Thus, the electrode modification material ($I_2$) contained in the active layer 13 is thermally diffused into the source/drain electrodes 14A, 14B. As a result, the portions of the source/drain electrodes 14A, 14B in contact with the channel forming region extension 13B are modified with the electrode modification material. Specifically, the modified regions 15 including CuI are formed (see FIG. 1D). The concentration of the electrode modification material in the portions of the source/drain electrodes 14A, 14B, which are modified with the electrode modification material, is decreased with distance from the interface between the source/drain electrodes 14A, 14B and the channel forming region extension 13B.

It is to be noted that in the [Step-120], when the copper layer is formed in accordance with a vapor deposition method while heating the whole, the electrode modification material can be diffused at the same time as the formation of the copper layer. Then, after the formation of the copper layer, the source/drain electrodes 14A, 14B modified with the electrode modification material can be obtained by patterning, and the [Step-130] can be skipped. It is to be noted that wholly heating is unnecessary in some cases.

[Step-140]

For example, in the manufacture of an image display device, following this step, the image display device can be manufactured by forming, in accordance with a well-known method, an image display unit (specifically, an image display unit including, for example, an organic electroluminescence element or an electrophoretic display element, a semiconductor light-emitting element, or the like) on or above the thus obtained TFT as an electronic device constituting a control unit (pixel driving circuit) of the image display device. In this case, the thus obtained electronic device constituting the control unit (pixel driving circuit) of the image display device and an electrode (for example, a pixel electrode) in the image display unit may be connected through a connection such as, a contact hole or a wiring. Alternatively, a passivation film (not shown) is formed over the entire surface. In this way, a bottom gate/top contact electronic device (an FET, specifically, a TFT) can be obtained. Alternatively, after the channel forming region extension 13B is subjected to patterning, a passivation film (not shown) may be formed over the entire surface. The foregoing steps can be also applied to Examples 2 to 8 described later.

In Example 1, the modification of the source/drain electrodes 14A, 14B with the electrode modification material can promote the optimization between the value of the work function in the portions (modified regions 15) of the source/drain electrodes 14A, 4B in contact with the channel forming region extension 13B and the value of the work function in the channel forming region extension 13B.

Figure 10:
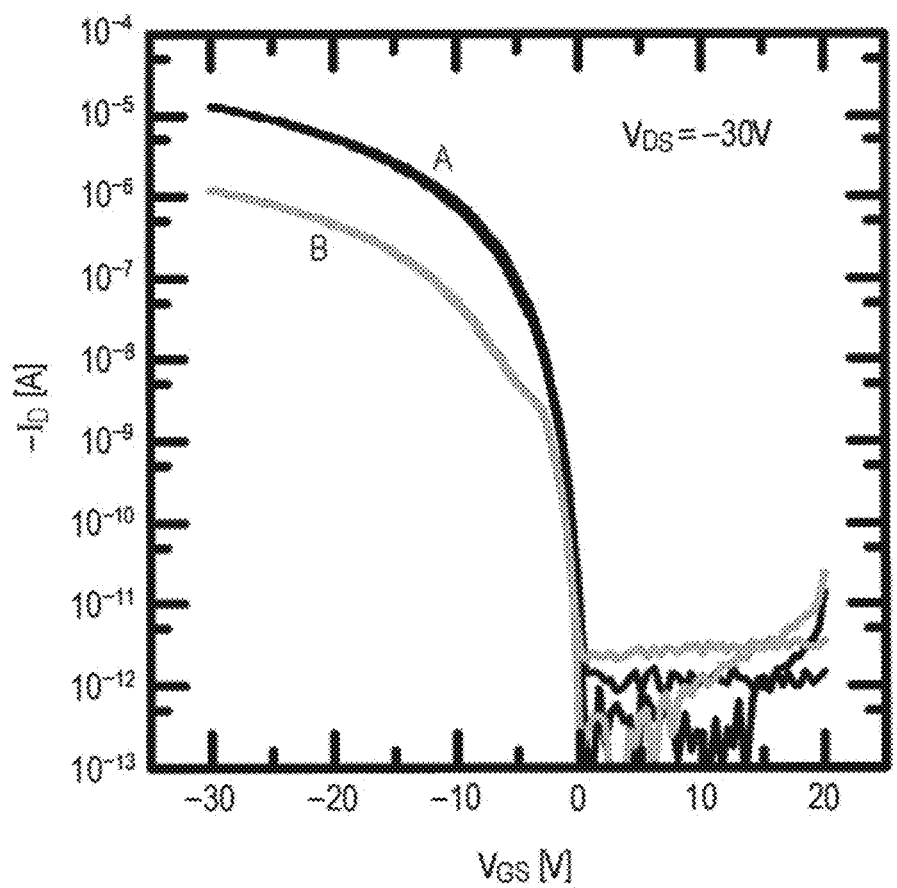
FIG. 10 is a graph showing measurement results of V-I characteristics of electronic devices (TFT) of Example 1 and a comparative example.

In this way, in the method for manufacturing an electronic device of Example 1, the electrode modification material contained in the active layer is diffused into the first electrode and the second electrode to modify, with the electrode modification material, the portions of the first electrode and second electrode in contact with the active layer. Furthermore, in the electronic device of Example 1, the portions of the first electrode and second electrode in contact with the active layer are modified with the electrode modification material. Accordingly, it becomes possible to improve the charge injection efficiency without causing any problems with adhesion and selectivity, reliability, or the like between the organic semiconductor layer and the source/drain electrodes. It is to be noted that V-I characteristics of the obtained TFT are shown in FIG. 10 where the "A" represents data on the TFT of Example 1 in which the portions of the first electrode and second electrode in contact with the active layer are modified with the electrode modification material, whereas the "B" represents data on a TFT of a comparative example in which portions of a first electrode and a second electrode in contact with an active layer are not modified with any electrode modification material.

Example 2

Figure 2A:
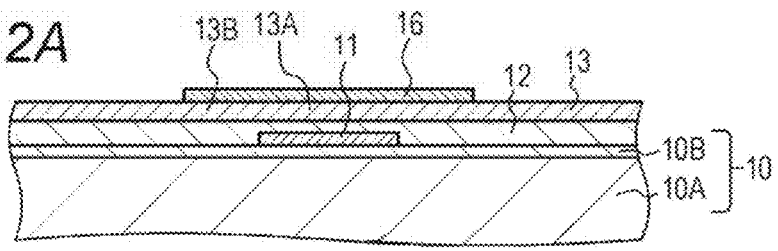
FIGS. 2A, 2B, 2C, and 2D are schematic partial cross-sectional views of a substrate and the like, for explaining a method for manufacturing an electronic device of Example 2.
Figure 2B:
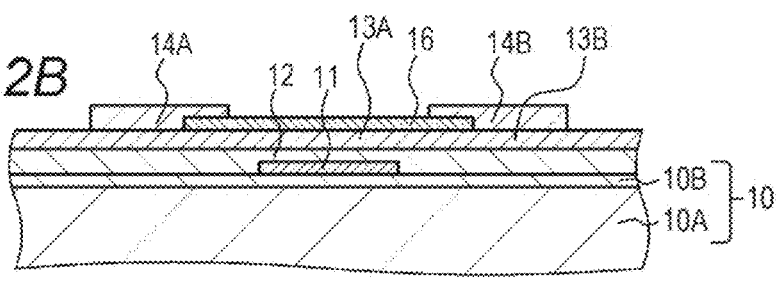
Figure 2C:
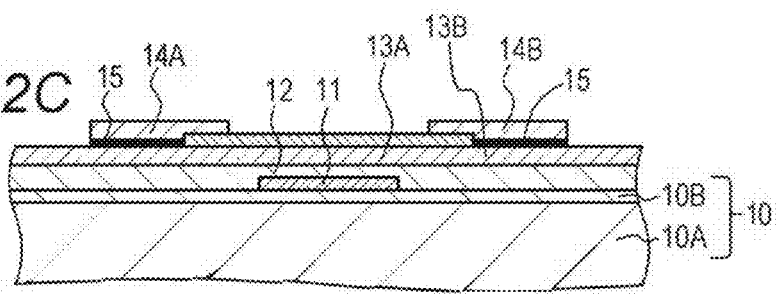

Example 2 is a modification of Example 1. A method for manufacturing a three-terminal electronic device (bottom gate/top contact TFT) of Example 2 will be described below with reference to FIGS. 2A, 2B, 2C, and 2D which are schematic partial cross-sectional views of a substrate and the like.
[Step-200]
First, similar steps as the [Step-100] through [Step-110] in Example 1 are executed.
[Step-210]
Next, a protective film 16 is formed over a portion of the active layer 13. Specifically, in accordance with a CVD method, the protective film 16 including a silicon oxide film is formed over the channel forming region 13A and over a portion of the channel forming region extension 13B (see FIG. 2A).
[Step-220]
Thereafter, the source/drain electrodes 14A, 14B are formed on the active layer 13 (specifically, on the channel forming region extension 13B) and the protective film 16. Specifically, the step is executed in similar way as in the [Step-120] in Example 1 (see FIG. 2B), and furthermore, the step is executed in similar way as in the [Step-130] (see FIG. 2C).

Figure 2D:
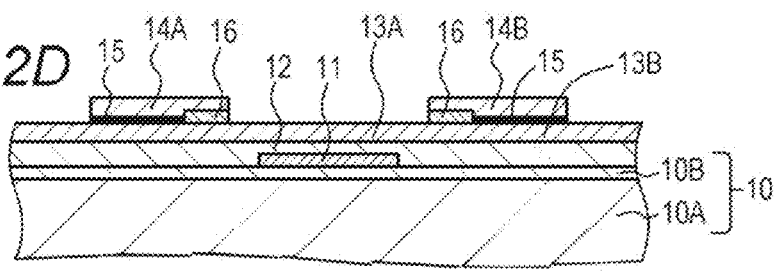

The TFT may be completed as just described, or as shown in FIG. 2D, after the [Step-220], specifically, the protective film 16 exposed between the source/drain electrodes 14, 14B may be removed after forming the source/drain electrodes 14A, 14B on the channel forming region extension 13B and the protective film 16.

Example 3

Example 3 relates to a method for manufacturing an electronic device according to the second aspect of the present disclosure, and an electronic device according to the first aspect of the present disclosure, as well as an image display device. The electronic device of Example 3 of a bottom gate/top contact type is a three-terminal electronic device, specifically, a TFT, which has largely similar configuration and structure as shown in FIG. 1D.

It is to be noted that the electrode modification material includes a thiol, specifically, tetrafluorobenzenethiol in Examples 3 to 4, Examples 7 to 8, and Example 9. Moreover, portions of the source/drain electrodes 14A, 14B in contact with the channel forming region extension 13B are modified with the electrode modification material, and the material constituting the source/drain electrodes 14A, 14B reacts with the electrode modification material in the portions of the source/drain electrodes 14A, 14B, which are modified with the electrode modification material (modified regions 18). Specifically, gold (Au) atoms constituting the source/drain electrodes 14A, 14B are bound to thiol groups.

Figure 3A:
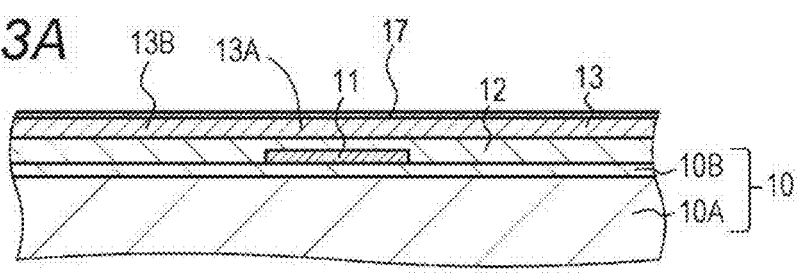
FIGS. 3A and 3B are schematic partial cross-sectional views of a substrate and the like, for explaining a method for manufacturing an electronic device of Example 3.
Figure 3B:
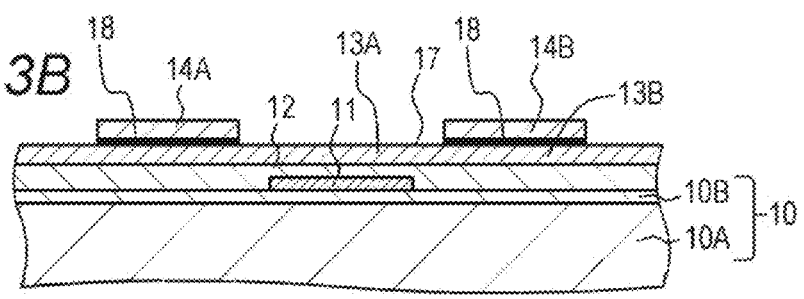

A method for manufacturing the three-terminal electronic device (bottom gate/top contact TFT) of Example 3 will be described below with reference to FIGS. 3A and 3B which are schematic partial cross-sectional views of a substrate and the like.
[Step-300]
First, after forming a gate electrode 11 and a gate insulating layer 12 covering the gate electrode 11 on a substrate 10, a channel forming region 13A and a channel forming region extension 13B including an organic semiconductor material are formed on the gate insulating layer 12. Specifically, the similar steps as the [Step-100] through [Step-110] in Example 1 may be executed. It is to be noted that an active layer 13 (channel forming region 13A and channel forming region extension 13B) including ethylphenyl-PXX of 30 nm in thickness is formed in Example 3.
[Step-310]
Then, an electrode modification material 17 is attached to the surfaces of the channel forming region 13A and channel forming region extension 13B. Specifically, the electrode modification material 17 (thiol molecules) can be attached to the channel forming region 13A and the channel forming region extension 13B by placing the channel forming region 13A and the channel forming region extension 13B in an atmosphere containing a vapor of tetrafluorobenzenethiol as the electrode modification material 17 (see FIG. 3A). It is to be noted that the electrode modification material 17 is shown in the form of a layer in the drawing for convenience sake. The gate insulating layer 12 and the channel forming region extension 13B may be subjected to patterning in accordance with a well-known method such as, a wet etching method, a dry etching method, and a laser ablation method, if necessary.
[Step-320]
Thereafter, in similar way as in the [Step-120] in Example 1, but with the use of gold (Au), source/drain electrodes 14A, 14B of 150 nm in thickness are formed, and in this case, a reaction is generated between the source/drain electrodes 14A, 14B and the electrode modification material 17 to modify, with an electrode modification material, portions (modified regions 18) of the source/drain electrodes 14A, 14B in contact with the channel forming region extension 13B (see FIG. 3B). Alternatively, depending on the electrode modification material used, the source/drain electrodes 14A, 14B may be formed, and then heated, and also in this case, a reaction is generated between the source/drain electrodes 14A, 14B and the electrode modification material 17 to modify, with the electrode modification material, portions of the source/drain electrodes 14A, 14B in contact with the channel forming region extension 13B. In patterning for the source/drain electrodes 14A, 14B, the unnecessary electrode modification material 17 is removed.

Then, a bottom gate/top contact electronic device (an FET, specifically, a TFT) can be obtained by executing similar step as the [Step-140] in Example 1. Also in Example 3, the modification of the source/drain electrodes 14A, 14B with the electrode modification material can promote the optimization between the value of the work function in the portions (modified regions 18) of the source/drain electrodes 14A, 14B in contact with the channel forming region extension 13B and the value of the work function in the channel forming region extension 13B.

In the method for manufacturing an electronic device of Example 3, the electrode modification material contained in the active layer is reacted with the first electrode and the second electrode to modify, with the electrode modification material, the portions of the first electrode and second electrode in contact with the active layer. Accordingly, it becomes possible to improve the charge injection efficiency without causing any problems with adhesion and selectivity, reliability, or the like between the organic semiconductor layer and the source/drain electrodes.

Example 4

Figure 4A:
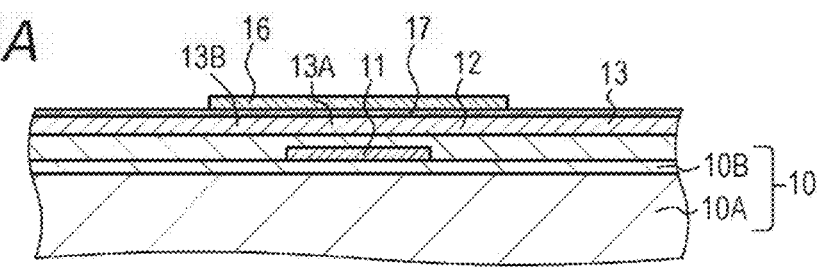
FIGS. 4A, 4B, and 4C are schematic partial cross-sectional views of a substrate and the like, for explaining a method for manufacturing an electronic device of Example 4.
Figure 4B:
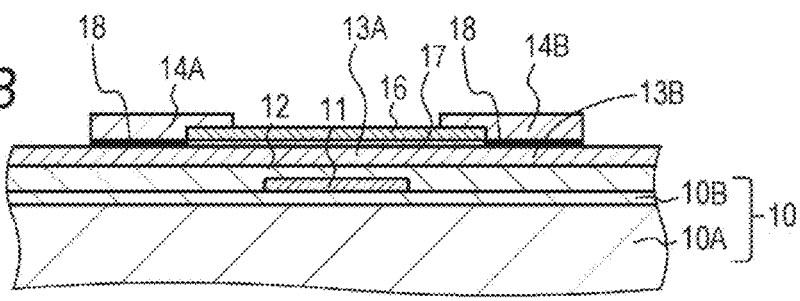

Example 4 is a modification of Example 3. A method for manufacturing a three-terminal electronic device (bottom gate/top contact TFT) of Example 4 will be described below with reference to FIGS. 4A, 4B, and 4C which are schematic partial cross-sectional views of a substrate and the like.
[Step-400]
First, similar steps as the [Step-300] through [Step-310] in Example 1 are executed.
[Step-410]
Next, a protective film 16 is formed over a portion of the active layer 13 in similar way as in the [Step-210] in Example 2 (see FIG. 4A).
[Step-420]
Thereafter, in similar way as in the [Step-320] in Example 3, the source/drain electrodes 14A, 14B are formed on the channel forming region extension 13B and the protective film 16 (see FIG. 4B).

Figure 4C:
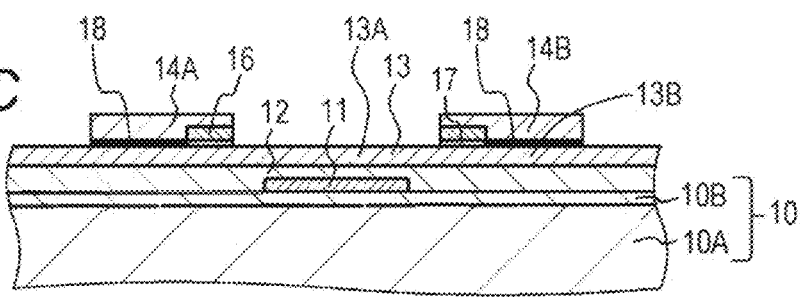

The TFT may be completed as just described, or as shown in FIG. 4C, after the [Step-420], specifically, the protective film 16 exposed between the source/drain electrodes 14A, 14B may be removed after forming the source/drain electrodes 14A, 14B on the channel forming region extension 13B and the protective film 16.

Example 5

Example 5 relates to a method for manufacturing an electronic device according to the third aspect of the present disclosure, and an electronic device according to the second aspect of the present disclosure, as well as an image display device.

Figure 5A:
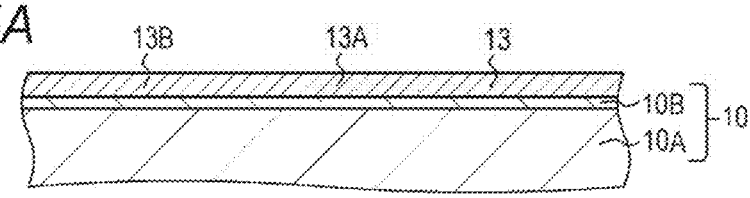
FIGS. 5A, 5B, 5C, and 5D are schematic partial cross-sectional views of a substrate and the like, for explaining a method for manufacturing an electronic device of Example 5.
Figure 5B:
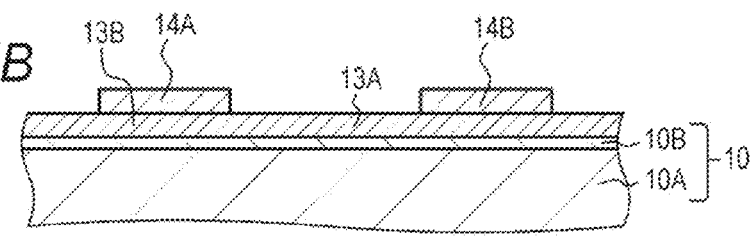
Figure 5C:
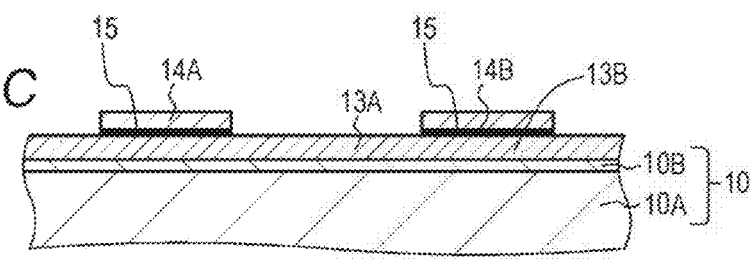
Figure 5D:
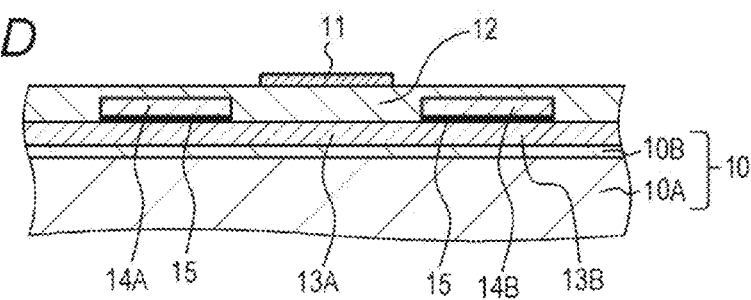

The electronic device of Example 5 of a top gate/top contact type is a three-terminal electronic device, specifically, a TFT, which is an electronic device including: as in the schematic partial cross-sectional view shown in FIG. 5D, (a) a channel forming region 13A and a channel forming region extension 13B including an organic semiconductor material, which are formed on a substrate 10;

(b) source/drain electrodes 14A, 14B formed on the channel forming region extension 13B;

(c) a gate insulating layer 12 formed on the channel forming region 13A and the source/drain electrodes 14A, 14B; and (d) a gate electrode 11 formed on the gate insulating layer 12, where portions of the source/drain electrodes 14A, 14B in contact with the channel forming region extension 13B are modified with an electrode modification material.

A method for manufacturing the three-terminal electronic device (top gate/top contact TFT) of Example 5 will be described below with reference to FIGS. 5A, 5B, 5C, and 5D which are schematic partial cross-sectional views of a substrate and the like.
[Step-500]
First, the channel forming region 13A and channel forming region extension 13B including an organic semiconductor material are formed on the substrate 10. In this case, the channel forming region 13A and channel forming region extension 13B are adapted to contain the electrode modification material. Specifically, similar step as the [Step-110] in Example 1 is executed. Specifically, a solution of the organic semiconductor material constituting the active layer (more specifically, a solution of ethylphenyl-PXX with toluene as a solvent) is formed into a film by a slit coater method, and dried at 140° C. to form the channel forming region 13A and channel forming region extension 13B of 20 nm in thickness. In this way, the structure shown in FIG. 5A can be obtained. Then, the channel forming region 13A and the channel forming region extension 13B can be placed in an atmosphere containing a vapor of iodine ($I_2$) as the electrode modification material to achieve the channel forming region 13A and channel forming region extension 13B containing the electrode modification material ($I_2$). The gate insulating layer 12 and the channel forming region extension 13B may be subjected to patterning in accordance with a well-known method such as, a wet etching method, a dry etching method, and a laser ablation method, if necessary. It is to be noted that the active layer 13 including the organic semiconductor material (the channel forming region 13A and the channel forming region extension 13B), containing the electrode modification material, can be also formed by allowing the electrode modification material to be contained in a solution of the organic semiconductor material constituting the active layer 13, and forming a film from the solution by an application method, and carrying out drying.
[Step-510]
Then, the source/drain electrodes 14A, 14B are formed on the active layer 13 (specifically, on the channel forming region extension 13B) in similar way as in the [Step-120] in Example 1. Specifically, after forming a copper (Cu) layer of 100 nm in thickness in accordance with a vacuum deposition method, the copper layer can be subjected to patterning in accordance with a lithography technique and an etching technique to obtain the source/drain electrodes 14A, 14B. It is to be noted that in the film formation for the source/drain electrodes 14A, 14B, the source/drain electrodes 14A, 14B can be formed without any photo lithography process by partially covering the channel forming region 13A and the channel forming region extension 13B with a hard mask. In addition, the source/drain electrodes 14A, 14B can be also formed in accordance with a printing method.
[Step-520]
Next, the electrode modification material is diffused to modify, with the electrode modification material, portions of the source/drain electrodes 14A, 14B in contact with the channel forming region extension 13B in similar way as in the [Step-130] in Example 1. Specifically, the whole is heated to 100° C. Thus, the electrode modification material ($I_2$) contained in the channel forming region extension 13B is thermally diffused into the source/drain electrodes 14A, 14B. As a result, the portions of the source/drain electrodes 14A, 14B in contact with the channel forming region extension 13B are modified with the electrode modification material. Specifically, the modified regions 15 including CuI are formed (see FIG. 5C). The concentration of the electrode modification material in the portions of the source/drain electrodes 14A, 14B, which are modified with the electrode modification material, is decreased with distance from the interface between the source/drain electrodes 14A, 14B and the channel forming region extension 13B.

[Step-530]

Thereafter, the gate insulating layer 12 and the gate electrode 11 are formed on the channel forming region 13A, the channel forming region extension 13B, and the source/drain electrodes 14A, 14B. Specifically, the gate insulating layer 12 of a cycloperfluorocarbon polymer (manufactured by Asahi Glass Co., Ltd., trade name: CYTOP) is formed on the active layer 13 and the source/drain electrodes 14A, 14B in accordance with a reverse offset printing method. Then, the gate electrode 11 is formed in similar way as in the [Step-100] in Example 1.

Then, a bottom gate/top contact electronic device (an FET, specifically, a TFT) can be obtained by executing similar step as the [Step-140] in Example 1.

In the method for manufacturing an electronic device of Example 5, the electrode modification material contained in the active layer is diffused into the first electrode and the second electrode to modify, with the electrode modification material, the portions of the first electrode and second electrode in contact with the active layer. Furthermore, in the electronic device of Example 5, the portions of the first electrode and second electrode in contact with the active layer are modified with the electrode modification material. Accordingly, it becomes possible to improve the charge injection efficiency without causing any problems with adhesion and selectivity, reliability, or the like between the organic semiconductor layer and the source/drain electrodes.

It is to be noted that in the [Step-510], when the copper layer is formed in accordance with a vapor deposition method while heating the whole, the electrode modification material can be diffused at the same time as the formation of the copper layer. Then, after the formation of the copper layer, the source/drain electrodes 14A, 14B modified with the electrode modification material can be obtained by patterning, and the [Step-520] can be skipped. Alternatively, the electrode modification material can be also diffused by skipping the [Step-520], and heating the hole after the [Step-530], and the source/drain electrodes 14A, 14B can be obtained which are modified with the electrode modification material. It is to be noted that wholly heating is unnecessary in some cases.

Example 6

Example 6 is a modification of Example 5. A method for manufacturing a three-terminal electronic device (top gate/top contact TFT) of Example 6 will be described below with reference to FIGS. 6A, 6B, 6C, and 6D which are schematic partial cross-sectional views of a substrate and the like.

[Step-600]

First, similar step as the [Step-500] in Example 5 is executed.

[Step-610]

Figure 6A:
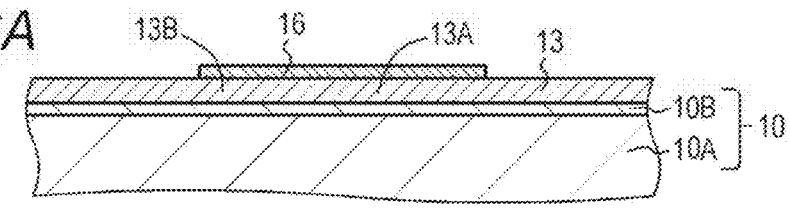
FIGS. 6A, 6B, 6C, and 6D are schematic partial cross-sectional views of a substrate and the like, for explaining a method for manufacturing an electronic device of Example 6.
Figure 6B:
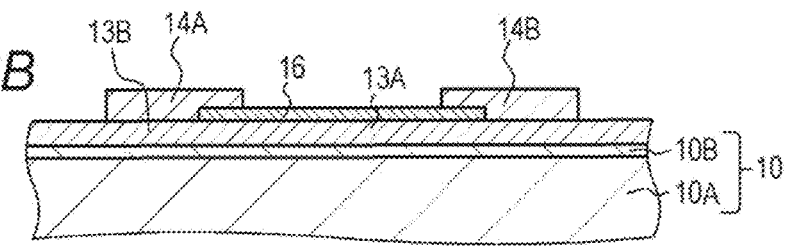
Figure 6C:
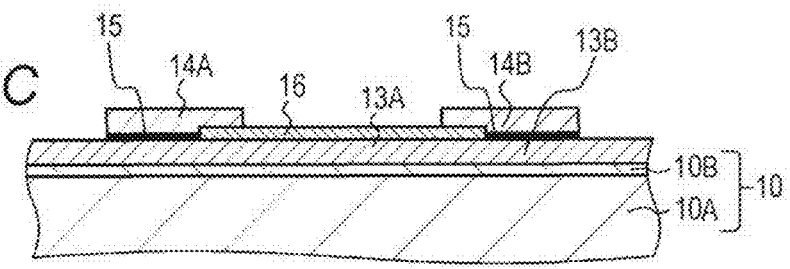

Next, a protective film 16 is formed over a portion of the active layer 13 in similar way as in the [Step-210] in Example 2 (see FIG. 6A).

[Step-620]

Figure 6D:
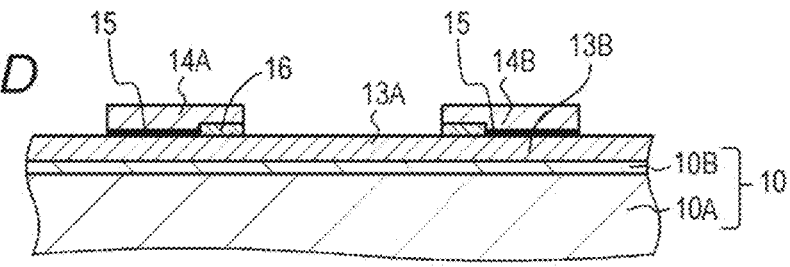

Thereafter, a TFT is completed, for example, by executing similar steps as the [Step-510] through [Step-520] in Example 5 (see FIGS. 6B and 6C), and further executing similar step as the [Step-530], or as shown in FIG. 6D, the protective film 16 exposed between the source/drain electrodes 14A, 14B may be removed after the [Step-520], specifically, after forming the source/drain electrodes 14A, 14B on the channel forming region extension 13B and the protective film 16.

Example 7

Example 7 relates to a method for manufacturing an electronic device according to the fourth aspect of the present disclosure, and an electronic device according to the second aspect of the present disclosure, as well as an image display device. The electronic device of Example 7 of a top gate/top contact type is a three-terminal electronic device, specifically, a TFT, which has largely similar configuration and structure as shown in FIG. 5D.

Figure 7A:
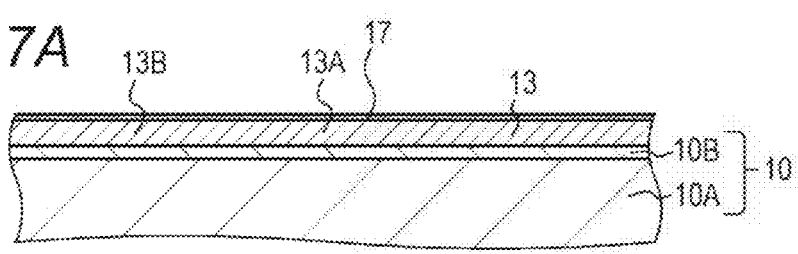
FIGS. 7A and 7B are schematic partial cross-sectional views of a substrate and the like, for explaining a method for manufacturing an electronic device of Example 7.
Figure 7B:
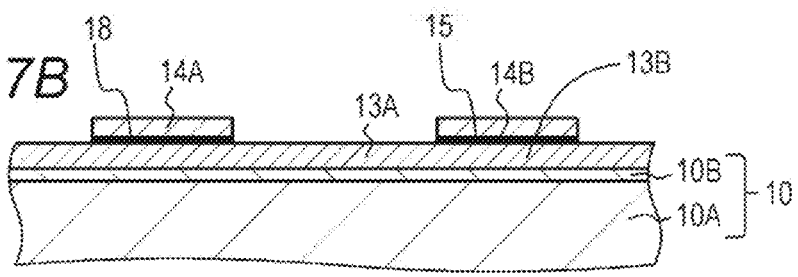

A method for manufacturing the three-terminal electronic device (top gate/top contact TFT) of Example 7 will be described below with reference to FIGS. 7A and 7B which are schematic partial cross-sectional views of a substrate and the like.

[Step-700]

First, the channel forming region 13A and channel forming region extension 13B including an organic semiconductor material are formed on the substrate 10 in similar way as in the [Step-500] in Example 5.

[Step-710]

Then, an electrode modification material 17 is attached to the surfaces of the channel forming region 13A and channel forming region extension 13B, in similar way as in the [Step-310] in Example 3.

[Step-720]

Thereafter, the first electrode 14A and the second electrode 14B are formed on the channel forming region extension 13B with the electrode modification material 17 attached to a surface thereof, in similar way as in the [Step-320] in Example 3. In this case, a reaction is generated between the source/drain electrodes 14A, 14B and the electrode modification material to modify, with the electrode modification material, portions (modified regions 18) of the source/drain electrodes 14A, 14B in contact with the channel forming region extension 13B (see FIG. 7B).

[Step-730]

Next, in similar way as in the [Step-530] in Example 5, the gate insulating layer 12 and the gate electrode 11 are formed on the channel forming region 13A, the channel forming region extension 13B, and the first electrode 14A and second electrode 14B.

Then, a bottom gate/top contact electronic device (an FET, specifically, a TFT) can be obtained by executing similar step as the [Step-140] in Example 1.

In the method for manufacturing an electronic device of Example 7, the electrode modification material attached to the surface of the active layer is reacted with the first electrode and the second electrode to modify, with the electrode modification material, the portions of the first electrode and second electrode in contact with the active layer. Accordingly, it becomes possible to improve the charge injection efficiency without causing any problems with adhesion and selectivity, reliability, or the like between the organic semiconductor layer and the source/drain electrodes.

It is to be noted that depending on the electrode modification material used, the source/drain electrodes 14A, 14B may be formed, and then heated, and also in this case, a reaction is generated between the source/drain electrodes 14A, 14B and the electrode modification material 17 to modify, with the electrode modification material, portions of the source/drain electrodes 14A, 14B in contact with the channel forming region extension 13B. Alternatively, without generating any reaction between the source/drain electrodes 14A, 14B and the electrode modification material in the [Step-720], the electrode modification material can be also reacted by heating the whole after the [Step-730] to modify, with the electrode modification material, the portions of the source/drain electrodes 14A, 14B in contact with the channel forming region extension 13B.

Example 8

Figure 8A:
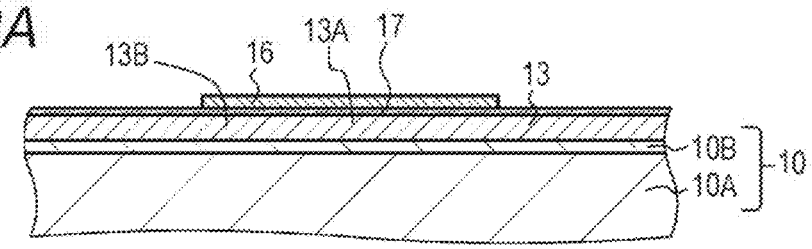
FIGS. 8A, 8B, and 8C are schematic partial cross-sectional views of a substrate and the like, for explaining a method for manufacturing an electronic device of Example 8.
Figure 8B:
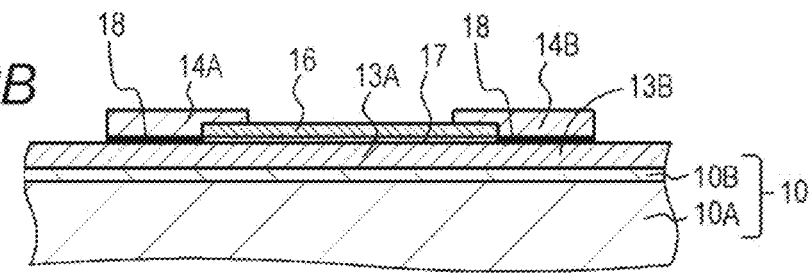
Figure 8C:
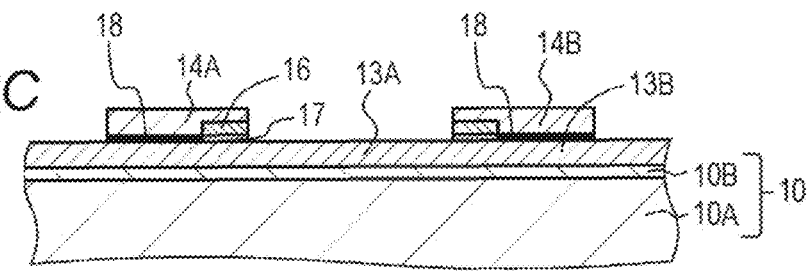

Example 8 is a modification of Example 7. A method for manufacturing the three-terminal electronic device (top gate/top contact TFT) of Example 8 will be described below with reference to FIGS. 8A, 8B, and 8C which are schematic partial cross-sectional views of a substrate and the like.
[Step-800]
First, similar steps as the [Step-700] through [Step-710] in Example 7 are executed.
[Step-810]
Next, a protective film 16 is formed over a portion of the active layer 13 in similar way as in the [Step-210] in Example 2 (see FIG. 8A).
[Step-820]
Thereafter, a TFT is completed by executing similar steps as the [Step-720] through [Step-730] in Example 7 (see FIG. 8B), or as shown in FIG. 8C, the protective film 16 exposed between the source/drain electrodes 14A, 14B may be removed after the [Step-720], specifically, after forming the source/drain electrodes 14A, 14B on the channel forming region extension 13B and the protective film 16.

Example 9

Example 9 relates to a sensor according to the present disclosure. The sensor of Example 9 includes the electronic device (the electronic device of a bottom gate/top contact type or a top gate/top contact type) described in Examples 1 through 8. This sensor of Example 9 constitutes, for example, a light-emitting element. More specifically, the sensor constitutes a light-emitting element (an organic light-emitting element, an organic light-emitting transistor) where the active layer 13 emits light through voltage application to the control electrode 11, the first electrode 14A, and the second electrode 14B. Then, the voltage applied to the control electrode 11 controls the current flowing through the active layer 13 from the first electrode 14A toward the second electrode 14B. When the bias to the first electrode 14A and the second electrode 14B is increased while holes are sufficiently accumulated, electron injection is started to emit light through recombination with the holes.

Alternatively, as the sensor of Example 9, the use of a dye which absorbs light (including not only visible light, but also ultraviolet light and infrared light) as organic semiconductor molecules can constitute an optical sensor, and it is possible to constitute a photoelectric conversion element (specifically, a solar cell or an image sensor) where a current flows between the first electrode 14A and the second electrode 14B by irradiating the active layer 13 with light (including not only visible light, but also ultraviolet light and infrared light). It is to be noted that the voltage application to the control electrode 11 makes it possible to modulate the flowing current.

In addition, the sensor can also include a chemical substance sensor for measuring the amount (concentration) of a chemical substance adsorbed on the active layer 13 by applying a current between the first electrode 14A and the second electrode 14B or applying an appropriate voltage between the first electrode 14A and the second electrode 14B, and measuring the electric resistance value of the active layer 13, using the fact that the electric resistance value between the first electrode 14A and the second electrode 14B is changed when the chemical substance to be detected is adsorbed onto the active layer 13.

While the present disclosure has been described with reference to the preferred examples, the present disclosure is not to be considered limited to these examples. The electronic devices, the image display devices, the sensors, and the compositions, structures, forming conditions, and manufacturing conditions of the methods for manufacturing the electronic devices, which have been described in the examples, by way of example, can be appropriately changed. In the case of applying or using the electronic device achieved according to the present disclosure, for example, to or for image display devices as well as various types of electronic appliances, a large number of electronic devices integrated on a substrate, a support, or a supporting member may be made as a monolithic integrated circuit, or each electronic device may be cut for individualization, and may be used as discrete components.

In addition, while the three-terminal electronic devices have been entirely described by way of example in the examples, two-terminal electronic devices can be adopted. Specifically, the method for manufacturing a two-terminal electronic device according to the first aspect is a method for manufacturing an electronic device, which includes the respective steps of:

(A) forming an active layer including an organic semiconductor material on a substrate; and (B) then forming a first electrode and a second electrode on the active layer, and the method further includes the respective steps of:

allowing the active layer to contain an electrode modification material in the step (A) or between the step (A) and the step (B), and diffusing the electrode modification material to modify, with the electrode modification material, portions of the first electrode and second electrode in contact with the active layer in the step (B) or after the step (B).

Alternatively, the method for manufacturing a two-terminal electronic device according to the first aspect is a method for manufacturing an electronic device, which includes the respective steps of:

(A) forming a first electrode on a substrate;

(B) then forming an active layer including an organic semiconductor material at least on the first electrode; and (C) then forming a second electrode on the active layer, and the method further includes the respective steps of:

allowing the active layer to contain an electrode modification material in the step (B) or between the step (B) and the step (C), and diffusing the electrode modification material to modify, with the electrode modification material, portions of the first electrode and second electrode in contact with the active layer in the step (C) or after the step (C).

In the method herein for manufacturing a two-terminal electronic device according to the first aspect, the electrode modification material can be thermally diffused as a form of the method, and in this case, the concentration of the electrode modification material in the portions of the first electrode and second electrode, which are modified with the electrode modification material can have the form of decrease with distance from the interface between the first electrode and second electrode and the active layer.

Alternatively, the method for manufacturing a two-terminal electronic device according to the second aspect is a method for manufacturing an electronic device, which includes the respective steps of:

(A) forming an active layer including an organic semiconductor material on a substrate; and (B) then forming a first electrode and a second electrode on the active layer, and the method further includes the respective steps of:

attaching an electrode modification material to a surface of the active layer between the step (A) and the step (B), and reacting the first electrode and second electrode with the electrode modification material to modify, with the electrode modification material, portions of the first electrode and second electrode in contact with the active layer in the step (B) or after the step (B).

In the method herein for manufacturing a two-terminal electronic device according to the second aspect, the portions of the first electrode and second electrode, which are modified with the electrode modification material, can have the form of 2 nm or less in thickness.

Moreover, a two-terminal electronic device includes: as in the schematic partial cross-sectional view shown in FIG. 9A, an active layer including an organic semiconductor material, which is formed on a substrate; and a first electrode and a second electrode formed on the active layer, and portions of the first electrode and second electrode in contact with the active layer are modified with an electrode modification material.

Alternatively, a two-terminal electronic device includes: as in the schematic partial cross-sectional view shown in FIG. 9B, a first electrode formed on a substrate;

an active layer including an organic semiconductor material, which is formed at least on the first electrode; and a second electrode formed on the active layer, and portions of the first electrode and second electrode in contact with the active layer are modified with an electrode modification material. This two-terminal electronic device can be allowed to function as an optical sensor, a photoelectric conversion element (specifically, a solar cell or an image sensor), or a light-emitting element by constituting the second electrode from a transparent conductive material and transmitting and emitting light through the second electrode, or by constituting the substrate and the first electrode from a transparent material and a transparent conductive material and transmitting and emitting light through the substrate and the first electrode.

In the method for manufacturing a two-terminal electronic device according to the first aspect or the second aspect, including the preferred forms described above, and the two-terminal electronic devices, the electrode modification material can be adapted to be at least one material selected from the group consisting of halogen atoms, thios, disulfides, chlorosilanes, alkoxysilanes, carboxylic acids, phenols, and phosphoric acids. Furthermore, the modification of the first electrode and second electrode with the electrode modification material is preferably adapted to promote the optimization between the value of the work function in the portions of the first electrode and second electrode in contact with the active layer and the value of the work function in the active layer.

Moreover, in the two-terminal electronic devices including the preferred forms and configurations described above, the concentration of the electrode modification material in the portions of the first electrode and second electrode, which are modified with the electrode modification material can be adapted to decrease with distance from the interface between the first electrode and second electrode and the active layer, or the portions of the first electrode and second electrode, which are modified with the electrode modification material, can be adapted to be 2 nm or less in thickness.

Further, a two-terminal sensor includes the two-terminal electronic device described above.

It is to be noted that the present disclosure can take the following configurations.

[1] <<Method for Manufacturing Electronic Device: First Aspect>>

A method for manufacturing an electronic device, which includes the respective steps of:

(A) forming a control electrode on a substrate, and an insulating layer covering the control electrode;

(B) then forming an active layer including an organic semiconductor material on the insulating layer; and (C) then forming a first electrode and a second electrode on the active layer, where the method further includes the respective steps of:

allowing the active layer to contain an electrode modification material in the step (B) or between the step (B) and the step (C), and diffusing the electrode modification material to modify, with the electrode modification material, portions of the first electrode and second electrode in contact with the active layer in the step (C) or after the step (C).

[2] <<Method for Manufacturing Electronic Device: Second Aspect>>

A method for manufacturing an electronic device, which includes the respective steps of:

(A) forming a control electrode on a substrate, and an insulating layer covering the control electrode;

(B) then forming an active layer including an organic semiconductor material on the insulating layer; and (C) then forming a first electrode and a second electrode on the active layer, where the method further includes the respective steps of:

attaching an electrode modification material to a surface of the active layer between the step (B) and the step (C), and reacting the first electrode and second electrode with the electrode modification material to modify, with the electrode modification material, portions of the first electrode and second electrode in contact with the active layer in the step (C) or after the step (C).

[3] The method for manufacturing an electronic device according to [1] or [2], where a protective film is formed over a portion of the active layer before forming the first electrode and the second electrode on the active layer, and the first electrode and the second electrode are formed on the active layer and the protective film in the (C).

[4] The method for manufacturing an electronic device according to [3], where the protective film exposed between the first electrode and the second electrode is removed after forming the first electrode and the second electrode on the active layer and the protective film.

[5] <<Method for Manufacturing Electronic Device: Third Aspect>>

A method for manufacturing an electronic device, which includes the respective steps of:

(A) forming an active layer including an organic semiconductor material on a substrate;

(B) then forming a first electrode and a second electrode on the active layer; and (C) then forming the insulating layer and the control electrode on the active layer, the first electrode, and the second electrode, where the method further includes the respective steps of:

allowing the active layer to contain an electrode modification material in the step (A) or between the step (A) and the step (B), and diffusing the electrode modification material to modify, with the electrode modification material, portions of the first electrode and second electrode in contact with the active layer in the step (B), or between the step (B) and the step (C), or after the step (C).

[6] <<Method for Manufacturing Electronic Device: Fourth Aspect>>

A method for manufacturing an electronic device, which includes the respective steps of:

(A) forming an active layer including an organic semiconductor material on a substrate;

(B) then forming a first electrode and a second electrode on the active layer; and (C) then forming the insulating layer and the control electrode on the active layer, the first electrode, and the second electrode, where the method further includes the respective steps of:

attaching an electrode modification material to a surface of the active layer between the step (A) and the step (B), and reacting the first electrode and the second electrode with the electrode modification material to modify, with the electrode modification material, portions of the first electrode and second electrode in contact with the active layer in the step (B), or between the step (B) and the step (C), or after the step (C).

[7] The method for manufacturing an electronic device according to [5] or [6], where a protective film is formed over a portion of the active layer before forming the first electrode and the second electrode on the active layer, and the first electrode and the second electrode are formed on the active layer and the protective film in the (B).

[8] The method for manufacturing an electronic device according to [7], where the protective film exposed between the first electrode and the second electrode is removed after forming the first electrode and the second electrode on the active layer and the protective film.

[9] The method for manufacturing an electronic device according to [1] or [5], where the electrode modification material is thermally diffused.

[10] The method for manufacturing an electronic device according to any one of [1] to [9], where the electrode modification material is at least one material selected from the group consisting of halogen atoms, thios, disulfides, chlorosilanes, alkoxysilanes, carboxylic acids, phenols, and phosphoric acids.

[11] The method for manufacturing an electronic device according to any one of [1] to [10], where the modification of the first electrode and second electrode with the electrode modification material promotes the optimization between the value of the work function in the portions of the first electrode and second electrode in contact with the active layer and the value of the work function in the active layer.

[12] The method for manufacturing an electronic device according to [1] or [5], where the concentration of the electrode modification material in the portions of the first electrode and second electrode, which are modified with the electrode modification material, decreases with distance from the interface between the first electrode and second electrode and the active layer.

[13] The method for manufacturing an electronic device according to [2] or [6], where the portions of the first electrode and second electrode, which are modified with the electrode modification material, are 2 nm or less in thickness.

[14] <<Electronic Device: First Aspect>>

An electronic device including:

a control electrode formed on a substrate;

an insulating layer covering the control electrode;

an active layer including an organic semiconductor material, which is formed on the insulating layer; and a first electrode and a second electrode formed on the active layer, where portions of the first electrode and second electrode in contact with the active layer are modified with an electrode modification material.

[15] <<Electronic Device: Second Aspect>>

An electronic device including:

an active layer including an organic semiconductor material, which is formed on a substrate;

a first electrode and a second electrode formed on the active layer, an insulating layer formed on the active layer, and the first electrode and the second electrode;

a control electrode formed on the insulating layer, where portions of the first electrode and second electrode in contact with the active layer are modified with an electrode modification material.

[16] The electronic device according to [14] or [15], where a protective film is formed between a portion of the first electrode and the active layer, and between a portion of the second electrode and the active layer.

[17] The electronic device according to [16], where the protective film extends on the active layer located between the first electrode and the second electrode.

[18] The electronic device according to any one of [14] to [17], where the electrode modification material is at least one material selected from the group consisting of halogen atoms, thios, disulfides, chlorosilanes, alkoxysilanes, carboxylic acids, phenols, and phosphoric acids.

[19] The electronic device according to any one of [14] to [18], where the modification of the first electrode and second electrode with the electrode modification material promotes the optimization between the value of the work function in the portions of the first electrode and second electrode in contact with the active layer and the value of the work function in the active layer.

[20] <<Image Display Device>>

An image display device including a semiconductor device including the electronic device according to [14] to [19], where the control electrode in the electronic device corresponds to a gate electrode in the semiconductor device, the insulating layer in the electronic device corresponds to a gate insulating layer in the semiconductor device, and the first electrode and second electrode in the electronic device correspond to source/drain electrodes in the semiconductor device.

[21] <<Sensor>>

A sensor including the electronic device according to [14] to [19].

[22] <<Method for Manufacturing Two-Terminal Electronic Device: First Aspect A>>

A method for manufacturing an electronic device, which includes the respective steps of:

(A) forming an active layer including an organic semiconductor material on a substrate; and (B) then forming a first electrode and a second electrode on the active layer, where the method further includes the respective steps of:

allowing the active layer to contain an electrode modification material in the step (A) or between the step (A) and the step (B), and diffusing the electrode modification material to modify, with the electrode modification material, portions of the first electrode and second electrode in contact with the active layer in the step (B) or after the step (B).

[23] <<Method for Manufacturing Two-Terminal Electronic Device: First Aspect B>>

A method for manufacturing an electronic device, which includes the respective steps of:

(A) forming a first electrode on a substrate;

(B) then forming an active layer including an organic semiconductor material at least on the first electrode; and (C) then forming a second electrode on the active layer, where the method further includes the respective steps of:

allowing the active layer to contain an electrode modification material in the step (B) or between the step (B) and the step (C), and diffusing the electrode modification material to modify, with the electrode modification material, portions of the first electrode and second electrode in contact with the active layer in the step (C) or after the step (C).

[24] The method for manufacturing an electronic device according to [22] or [23], where the electrode modification material is thermally diffused.

[25] The method for manufacturing an electronic device according to any one of [22] to [24], where the concentration of the electrode modification material in the portions of the first electrode and second electrode, which are modified with the electrode modification material, decreases with distance from the interface between the first electrode and second electrode and the active layer.

[26] <<Method for Manufacturing Two-Terminal Electronic Device: Second Aspect>>

A method for manufacturing an electronic device, which includes the respective steps of:

(A) forming an active layer including an organic semiconductor material on a substrate; and (B) then forming a first electrode and a second electrode on the active layer, where the method further includes the respective steps of:

attaching an electrode modification material to a surface of the active layer between the step (A) and the step (B), and reacting the first electrode and second electrode with the electrode modification material to modify, with the electrode modification material, portions of the first electrode and second electrode in contact with the active layer in the step (B) or after the step (B).

[27] The method for manufacturing an electronic device according to [26], where the portions of the first electrode and second electrode, which are modified with the electrode modification material, are 2 nm or less in thickness.

[28] The method for manufacturing an electronic device according to any one of [22] to [27], where the electrode modification material is at least one material selected from the group consisting of halogen atoms, thios, disulfides, chlorosilanes, alkoxysilanes, carboxylic acids, phenols, and phosphoric acids.

[29] The method for manufacturing an electronic device according to any one of [22] to [28], where the modification of the first electrode and second electrode with the electrode modification material promotes the optimization between the value of the work function in the portions of the first electrode and second electrode in contact with the active layer and the value of the work function in the active layer.

[30] <<Electronic Device: Two-Terminal Type, First Aspect>>

An electronic device including an active layer including an organic semiconductor material, which is formed on a substrate; and a first electrode and a second electrode formed on the active layer, where portions of the first electrode and second electrode in contact with the active layer are modified with an electrode modification material.

[31] <<Electronic Device: Two-Terminal Type, Second Aspect>>

An electronic device including:

a first electrode formed on a substrate;

an active layer including an organic semiconductor material, which is formed at least on the first electrode; and a second electrode formed on the active layer, where portions of the first electrode and second electrode in contact with the active layer are modified with an electrode modification material.

[32] The electronic device according to [30] or [31], where the electrode modification material is at least one material selected from the group consisting of halogen atoms, thios, disulfides, chlorosilanes, alkoxysilanes, carboxylic acids, phenols, and phosphoric acids.

[33] The electronic device according to any one of [30] to [32], where the modification of the first electrode and second electrode with the electrode modification material promotes the optimization between the value of the work function in the portions of the first electrode and second electrode in contact with the active layer and the value of the work function in the active layer.

[34] The electronic device according to any one of [30] to [33], where the concentration of the electrode modification material in the portions of the first electrode and second electrode, which are modified with the electrode modification material, decreases with distance from the interface between the first electrode and second electrode and the active layer.

[35] The electronic device according to any one of [30] to [33], where the portions of the first electrode and second electrode, which are modified with the electrode modification material, are 2 nm or less in thickness.

[36] <<Sensor: Two-Terminal Type>>

A sensor including the electronic device according to any one of [30] to [35].

REFERENCE SIGNS LIST 10 substrate
10A glass substrate
10B insulating film
11 control electrode (gate electrode)
12 insulating layer (gate insulating layer)
13 active layer
13A channel forming region
13B channel forming region extension
14A, 14B first electrode and second electrode (source/drain electrode)
15, 18 portions of source/drain electrodes modified with electrode modification material (modified region)
16 protective film
17 electrode modification material

The invention claimed is:

1. A display device, comprising:
a control electrode on a substrate;
an insulating layer that covers the control electrode;
an active layer on the insulating layer, wherein the active layer includes an organic semiconductor material;
a first electrode on the active layer; and
a second electrode on the active layer,
wherein a portion of the first electrode and a portion of the second electrode in contact with the active layer are modified with an electrode modification material, and
wherein a concentration of the electrode modification material, in the modified portion of the first electrode and the modified portion of the second electrode, decreases based on a distance from an interface between the first electrode and the second electrode to the active layer.

2. The display device according to claim 1, wherein the modification of the portion of the first electrode and the portion of the second electrode with the electrode modification material promotes an optimization between a first value of a first work function in the portion of the first electrode and the portion of the second electrode and a second value of a second work function in the active layer.

3. The display device according to claim 1, wherein the electrode modification material comprises at least one material selected from a group consisting of halogen atoms, thios, disulfides, chlorosilanes, alkoxysilanes, carboxylic acids, phenols, and phosphoric acids.

4. The display device according to claim 1, further comprising a protective film between the modified portion of the first electrode and the active layer, and between the modified portion of the second electrode and the active layer.

5. The display device according to claim 4, wherein the protective film extends on a portion of the active layer that is between the first electrode and the second electrode.

6. The display device according to claim 4, wherein the protective film includes a silicon oxide film.

7. A sensor, comprising:
a control electrode on a substrate;
an insulating layer that covers the control electrode;
an active layer on the insulating layer, wherein the active layer includes an organic semiconductor material;
a first electrode on the active layer; and
a second electrode on the active layer,
wherein a portion of the first electrode and a portion of the second electrode in contact with the active layer are modified with an electrode modification material, and
wherein a concentration of the electrode modification material, in the modified portion of the first electrode and the modified portion of the second electrode, decreases based on a distance from an interface between the first electrode and the second electrode to the active layer.

8. The sensor according to claim 7, wherein the modification of the portion of the first electrode and the portion of the second electrode with the electrode modification material promotes an optimization between a first value of a first work function in the portion of the first electrode and the portion of the second electrode and a second value of a second work function in the active layer.

9. The sensor according to claim 7, wherein the electrode modification material comprises at least one material selected from a group consisting of halogen atoms, thios, disulfides, chlorosilanes, alkoxysilanes, carboxylic acids, phenols, and phosphoric acids.

10. The sensor according to claim 7, further comprising a protective film between the modified portion of the first electrode and the active layer, and between the modified portion of the second electrode and the active layer.

11. The sensor according to claim 10, wherein the protective film extends on a portion of the active layer that is between the first electrode and the second electrode.

12. The sensor according to claim 10, wherein the protective film includes a silicon oxide film.

13. The sensor according to claim 7, further comprising a chemical substance sensor configured to measure an amount of concentration of a chemical substance adsorbed on the active layer, based on an application of a current between the first electrode and the second electrode.

14. A display device, comprising:
a control electrode on a substrate;
an insulating layer that covers the control electrode;
an active layer on the insulating layer, wherein the active layer includes an organic semiconductor material;
a first electrode on the active layer;
a second electrode on the active layer,
wherein a portion of the first electrode and a portion of the second electrode in contact with the active layer are modified with an electrode modification material; and
a protective film between the modified portion of the first electrode and the active layer, and between the modified portion of the second electrode and the active layer.

* * * * *